United States Patent [19]
Ohno

[11] Patent Number: 5,315,432
[45] Date of Patent: * May 24, 1994

[54] THIN FILM OF LITHIUM NIOBATE SINGLE CRYSTAL

[75] Inventor: Satoshi Ohno, Ibigawa, Japan

[73] Assignee: Ibiden Co., Ltd., Ogaki, Japan

[*] Notice: The portion of the term of this patent subsequent to May 17, 2010 has been disclaimed.

[21] Appl. No.: 777,312

[22] PCT Filed: Feb. 1, 1991

[86] PCT No.: PCT/JP91/00126

§ 371 Date: Dec. 2, 1991

§ 102(e) Date: Dec. 2, 1991

[87] PCT Pub. No.: WO92/09917

PCT Pub. Date: Jun. 11, 1992

[30] Foreign Application Priority Data

Nov. 30, 1990 [JP] Japan .................................. 2-330262

[51] Int. Cl.$^5$ .............................................. H03F 7/00
[52] U.S. Cl. ...................................... 359/326; 359/332; 385/122; 385/129; 385/130
[58] Field of Search ................... 385/14, 11, 122, 129, 385/130, 131; 359/326, 327, 328, 329, 330, 331, 332

[56] References Cited

U.S. PATENT DOCUMENTS

| | | | |
|---|---|---|---|
| 3,998,687 | 12/1976 | Ballman et al. | 423/593 |
| 4,001,076 | 1/1977 | Robinson et al. | 423/184 |
| 4,073,675 | 2/1978 | Ballman et al. | 385/14 |
| 4,093,781 | 6/1978 | Heinz et al. | 428/539 |
| 4,696,536 | 9/1987 | Albares et al. | 385/37 |
| 4,953,931 | 9/1990 | Mizayaki et al. | 359/328 |
| 5,039,187 | 8/1991 | Ballman et al. | 385/141 |
| 5,158,823 | 10/1992 | Enomoto et al. | 359/332 |
| 5,175,784 | 12/1992 | Enomoto et al. | 359/332 |
| 5,209,917 | 5/1993 | Ohno et al. | 423/592 |
| 5,227,011 | 7/1993 | Enomoto et al. | 156/643 |

FOREIGN PATENT DOCUMENTS

| | | |
|---|---|---|
| 0444209 | 4/1991 | European Pat. Off. |
| 63-195198 | 8/1988 | Japan |
| 2-12135 | 1/1990 | Japan |

OTHER PUBLICATIONS

Veronov et al. CA97(16):136726b (1981).
Journal of Crystal Growth, vol. 46, No. 5, May 1979, Amsterdam, NL, pp. 607–609, Sugii, et al. "Direct...".
Patent Abstracts of Japan, vol. 14, No. 146, (C-704) (4089) May 20, 1990 and JP-A-21 8 395 (Hitachi Metals Ltd.) Jan. 22, 1990.
Tien et al., "Light Beam Scanning and Deflection in Epitaxial LiNbO$_3$ Electrooptic Waveguides", Applied Physics Letters, vol. 25, No. 10, pp. 563–565, Nov. 15, 1964.
Ballman, et al., "The Growth of LiNbO$_3$ Thin Films by Liquid Phase Epitaxial Techniques," Journal of Crystal Growth, vol. 29, pp. 289–295 (1975).
Neurgaonkar, et al. Epitaxial Growth of Ferroelectric Films for Opto-Electronic (SAW) Applications, Journal of Crystal Growth, vol. 84, pp. 409–412, (1987).
WPI Acc No: 77-85568Y/48, Document No. 001864534, WPI-Derwent Database, "JP 52125286 and JP84043838," Oct. 20, 1977 and Oct. 24, 1984 respectively.

*Primary Examiner*—Frank Gonzalez
*Attorney, Agent, or Firm*—Sherman and Shalloway

[57] ABSTRACT

This invention relates to a thin film of lithium niobate single crystal formed on a lithium tantalate substrate having a high electrooptical constant and a low propagation loss, which can be utilized in a thin-film waveguiding second harmonic generating devices for converting the wavelength of an incident laser beam to a ½ level, characterized in that the lattice constant of the thin film of lithium niobate single crystal is matched with that of the lithium tantalate substrate.

16 Claims, 9 Drawing Sheets

THIN FILM OF LITHIUM NIOBATE SINGLE CRYSTAL

FIELD OF THE INVENTION

This invention relates to a thin film of lithium niobate (LiNbO$_3$) single crystal which is suitably applied in various optical materials including thin film wave-guiding second harmonic generating devices.

BACKGROUND OF THE INVENTION

With the recent development of optics-applied technique, shorter wavelength laser beam sources are increasing in demand.

Such shorter wavelength laser beam sources can improve recording density and photosensitivity and can be applied in the field of optical appliances such as optical memory discs and laser printers.

Thus, second harmonic generating (SHG) devices which can convert the wavelength of the incident laser beam into a ½ level have been studied.

A bulk of nonlinear optical single crystal has conventionally been used in such SHG devices utilizing high-output gas lasers as the light sources. However, gas laser is now being replaced mainly by semiconductor laser since there are strong demands for much smaller devices such as optical memory disc apparatus and laser printers, and since the semiconductor laser is less expensive and allows direct light modulation while the gas laser requires an external light modulator. Accordingly, thin film wave-guiding SHG devices are now in demand in order to obtain high conversion efficiency using a low light source output of several mW to several tens of mW.

As the nonlinear optical materials for such thin film wave-guiding SHG devices, those having a waveguide layer of a bulk of lithium niobate single crystal on which Ti or the like is diffused so as to modify refractive index, and those having a waveguide made of a thin film of lithium niobate single crystal formed on a lithium tantalate substrate by high-frequency sputtering process are known. However, it is difficult to obtain a thin film of lithium niobate single crystal having excellent crystallinity in either of these methods, and thus they failed to afford high conversion efficiency.

By the way, the Liquid Phase Epitaxial Method is supposed to be an ideal way of forming a thin film of single crystal having excellent crystallinity.

The Liquid Phase Epitaxial Method for forming a thin film of lithium niobate is described, for example, in:

(1) Applied Physics Letters, Vol. 26, No. 1, January 1975, wherein a thin film of lithium niobate is formed as an optical waveguide on a lithium tantalate substrate by liquid phase epitaxial growth using Li$_2$O and V$_2$O$_5$ as a flux;

(2) Japanese Patent Publication No. 9720/1976, wherein a thin film of lithium niobate is formed as an optical waveguide on a lithium tantalate substrate by liquid phase epitaxial growth using Li$_2$O and V$_2$O$_5$ as a flux; and (3) Japanese Patent Publication No. 47160/1981, wherein a solid solution thin film of lithium niobate/lithium tantalate single crystal containing magnesium is formed on a substrate by epitaxial growth using Li$_2$O and V$_2$O$_5$ as a flux.

However, the known Liquid Phase Epitaxial Method is neither successful in forming a thin film of lithium niobate single crystal having excellent crystallinity on the lithium tantalate substrate nor can form a film of lithium niobate single crystal having a sufficient film thickness required for producing a SHG device, and thus no practical thin film wave-guiding SHG device is so far known.

The film thickness required for producing a thin film wave-guiding SHG device is such that the effective index of an incident laser beam having a fundamental wavelength of $\lambda$ can be made consistent with that of the second harmonic with a wavelength of $\lambda/2$ in order to achieve phase-matching between them. Particularly, when a SHG device for semiconductor laser is produced using a thin film of lithium niobate formed on a lithium tantalate substrate, the thin film of lithium niobate single crystal should have a thickness of not less than 5 $\mu$m so as to achieve such consistency between these two effective indexes.

On the other hand, in order to obtain a high-output thin film wave-guiding SHG device, a greater index difference must be secured between the substrate and the thin film waveguide layer, and studies are made for reducing refractive index of the substrate; for example, as disclosed in:

(4) Japanese Patent Publication No. 34722/1985, wherein magnesium oxide and vanadium pentaoxide are simultaneously incorporated to a lithium tantalate single crystal substrate to form a thin film of lithium tantalate single crystal thereon by epitaxial growth method; and (5) Japanese Patent Publication No. 27681/1988, wherein vanadium pentaoxide is diffused on a lithium tantalate single crystal substrate to form a diffusion layer consisting of vanadium pentaoxide and lithium tantalate with a thickness of 5 to 6 $\mu$m and a low refractive index, followed by epitaxial growth of a layer of lithium tantalate single crystal thereon to form a triple-layered optical waveguide.

These methods disclosed all use lithium tantalate as the thin film waveguide layer and are not the technique for forming a thin film of lithium niobate single crystal having excellent optical properties on the lithium tantalate substrate.

In addition to the above methods, the following are also known as disclosed in:

(6) Journal of Crystal Growth, Vol. 54 (1981) pp. 572–576, wherein sodium is incorporated into lithium niobate to form a sodium-containing thin film of lithium niobate single crystal having a thickness of 20 $\mu$m on a Y-cut lithium niobate substrate by liquid phase epitaxial growth;

(7) Journal of Crystal Growth, Vol. 84 (1987) pp. 409–412, wherein sodium is incorporated into lithium niobate to form a sodium-containing thin film of lithium niobate single crystal on a Y-cut lithium tantalate substrate by liquid phase epitaxial growth;

(8) U.S. Pat. No. 4,093,781, wherein a strain-free lithium ferrite film is formed on a substrate by liquid phase epitaxial growth by partly substituting lithium with sodium to effect matching of lattice constant of the film with that of the substrate; and (9) Japanese Provisional Patent Publication No. 142477/1977, wherein crystal grains are allowed to grow slowly and naturally by allowing crystallization to occur very slowly to obtain a strain-free crystal by liquid phase epitaxial growth.

None of the above techniques of (6) to (9) discloses use of the thin film as optical materials.

As described above, there has not so far been disclosed a thin film of lithium niobate single crystal, formed on the lithium tantalate substrate, having excellent optical properties and a sufficient film thickness for providing optical devices including SHG devices.

The present inventors made various studies with a view to solving these problems to notice that a thin film of lithium niobate single crystal having a film thickness sufficient for producing optical devices including SHG devices and also excellent optical properties such as low optical damage (change in the refractive index of a crystal to be caused by irradiation of a high intensity light) and very low propagation loss can practically be formed by subjecting the thin film of lithium niobate single crystal and the lithium tantalate substrate to lattice matching, and they previously accomplished an invention (see Japanese Patent Application No. 247179/1990).

As the result of their further study, they found that if the lithium niobate single crystal has some degree of propagation loss, it can sufficiently be used as an optical device.

On the other hand, according to the conventional liquid phase epitaxial growth method, for example, as described in Applied Physics Letter, Vol. 24, No. 9, 1974, pp. 424–426, the thin film of lithium niobate single crystal formed on a lithium tantalate substrate comes to have an electrooptical constant of merely about ⅓ that of the bulk of lithium niobate.

Thus, the present inventors found that this is because of the difference between the lattice constant of the thin film of lithium niobate single crystal and that of the lithium tantalate substrate and that a thin film of lithium niobate single crystal having a high electrooptical constant which has never been attained can be formed by achieving lattice matching between them, and they accomplished this invention.

DISCLOSURE OF THE INVENTION

The gist of this invention is a thin film of lithium niobate single crystal formed on a lithium tantalate substrate characterized in that lattice matching is achieved between the thin film and the substrate.

Although lattice matching cannot be directly identified electron-microscopically, the stripe pattern observable in the photograph is continuous between the lithium tantalate single crystal substrate and the thin film of lithium niobate single crystal, and if no lattice matching is achieved between them, the stripe pattern will be discontinuous at the interface thereof. Accordingly, this photograph indirectly demonstrates that lattice matching is successfully achieved between the lithium tantalate single crystal substrate and the thin film of lithium niobate single crystal.

Figure 3:
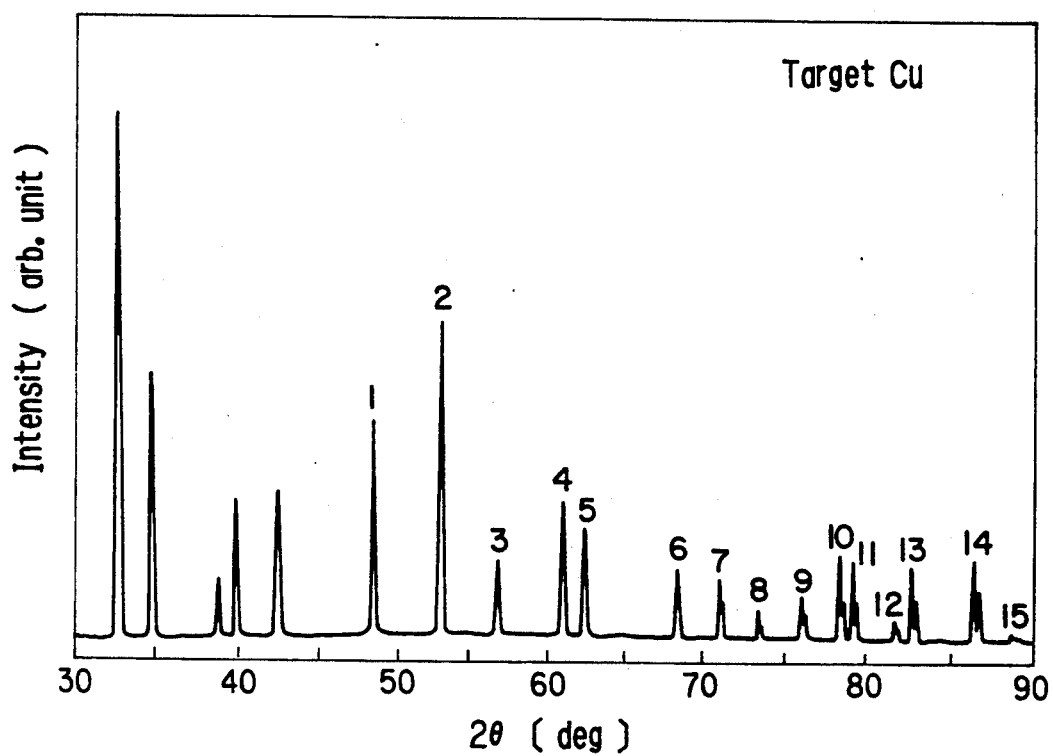

FIG. 3 shows an X-ray diffraction pattern of the thin film of lithium niobate single crystal of this invention.

Figure 4:
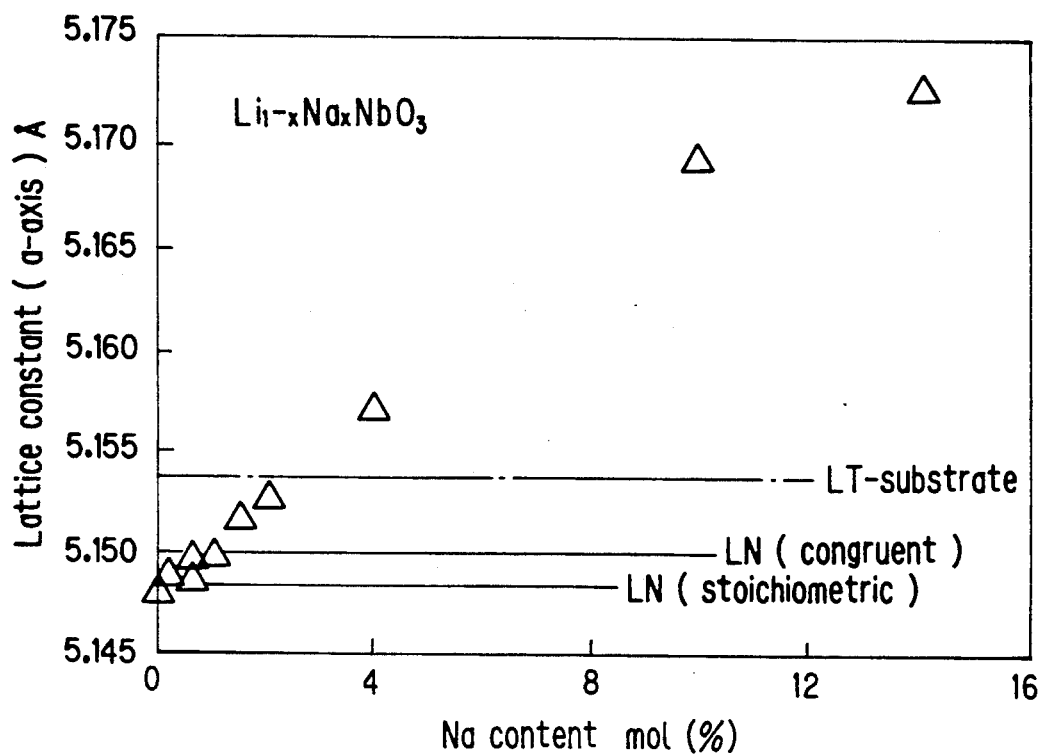

FIG. 4 shows the relationship between the a-axis lattice constant of the thin film of lithium niobate single crystal and the Na content thereof.

Figure 5:
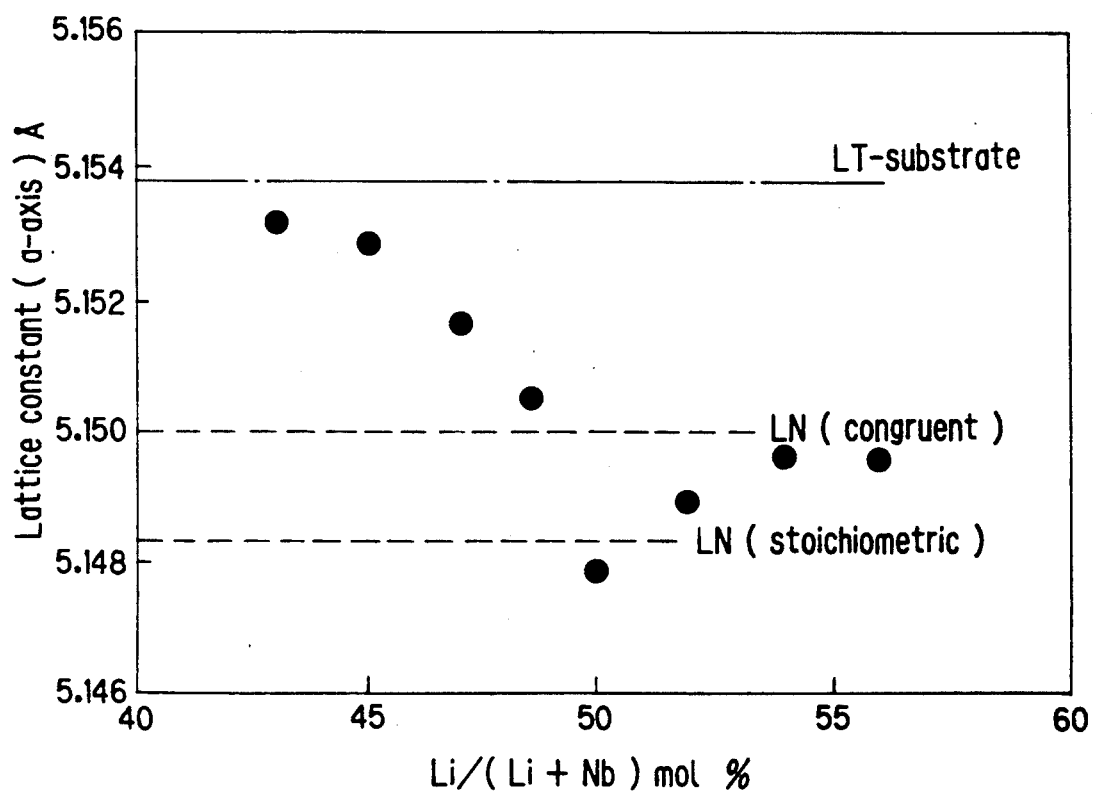

FIG. 5 shows the relationship between the a-axis lattice constant of the thin film of lithium niobate single crystal and the Li/Nb molar ratio thereof.

Figure 6:
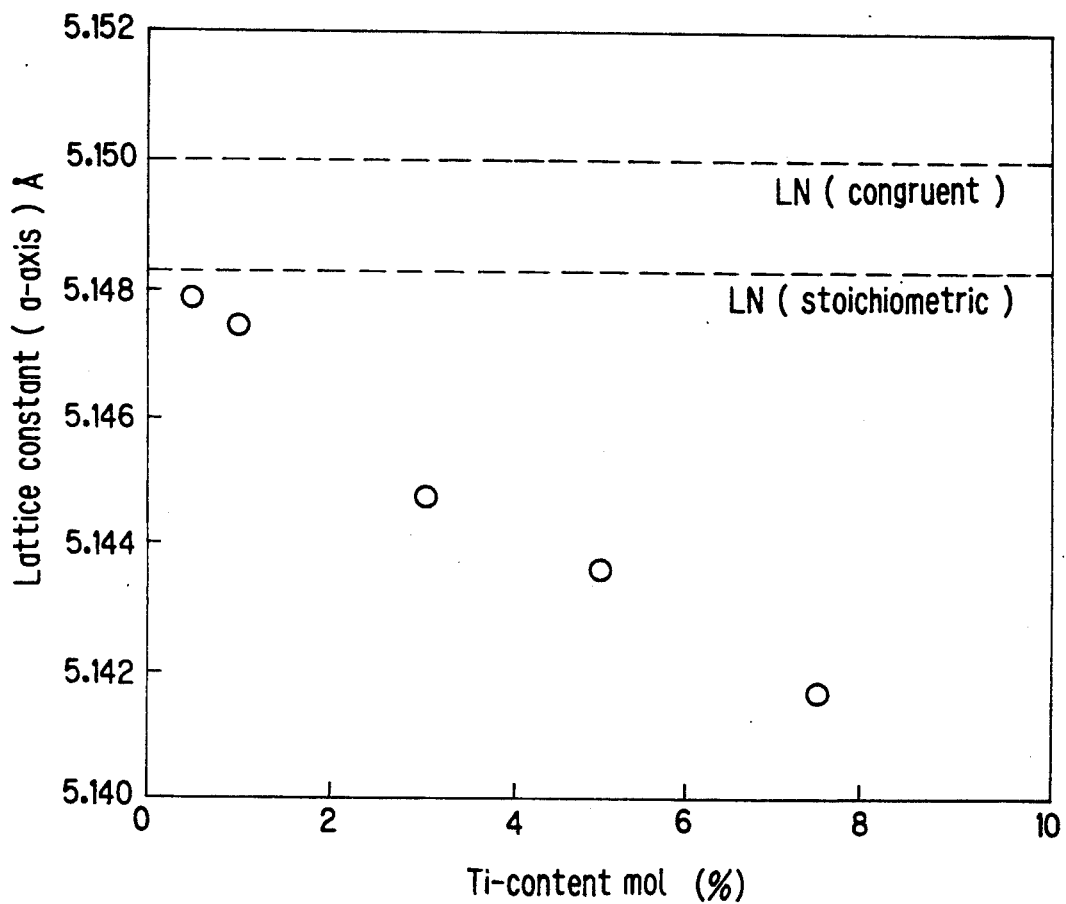

FIG. 6 shows the relationship between the a-axis lattice constant of the thin film of lithium niobate single crystal and the Ti content thereof.

Figure 7:
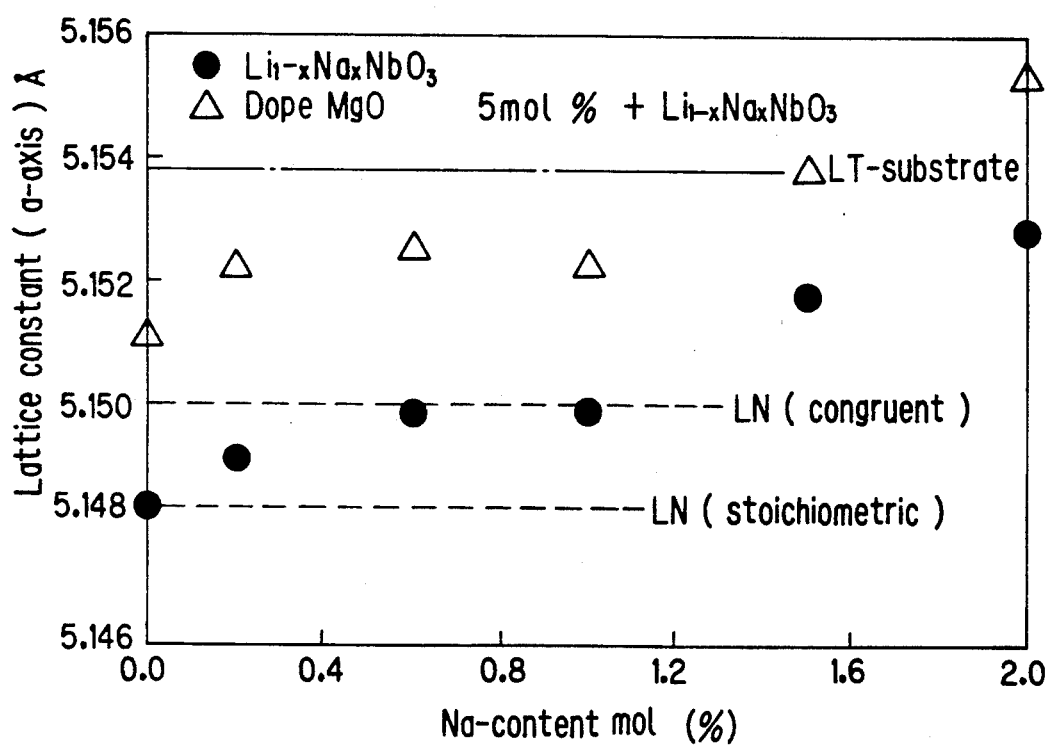

FIG. 7 shows the relationship between the Na content in the thin film of lithium niobate single crystal and the a-axis lattice constant thereof, when 5 mol % of MgO is incorporated therein, wherein ● the case where only Na is incorporated, while Δ shows the case where Na and 5% of MgO are incorporated.

Figure 8:
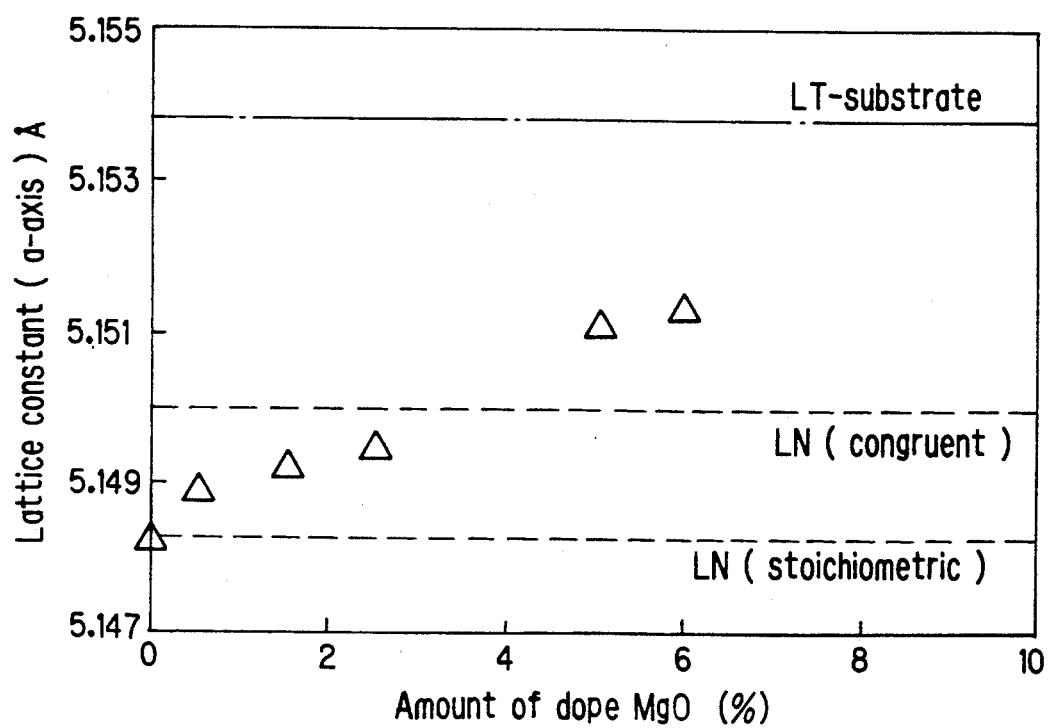

FIG. 8 shows the relationship between the a-axis lattice constant of the thin film of lithium niobate single crystal and the MgO content thereof.

Figure 9:
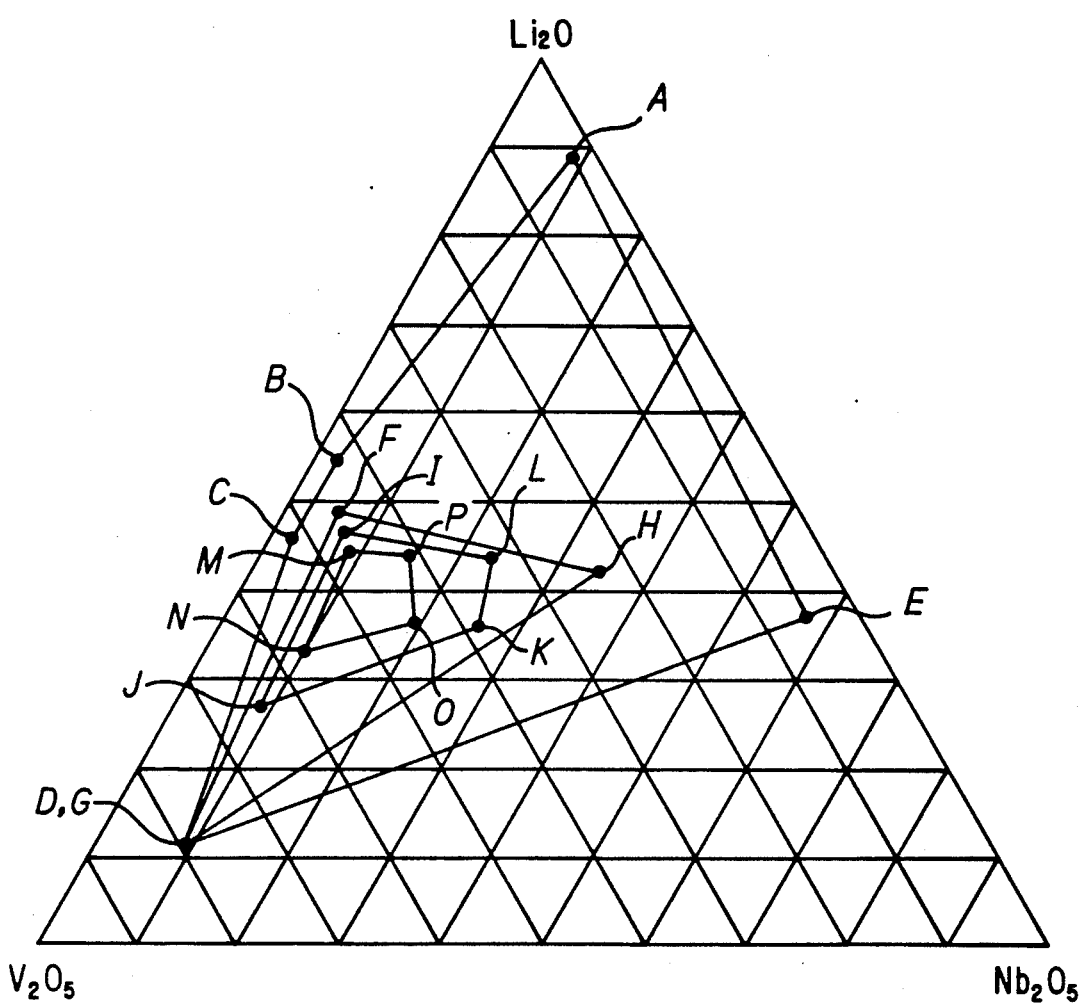

FIG. 9 shows a triangular map of $Li_2O$-$V_2O_5$-$Nb_2O_5$ ternary system.

| | $Li_2O/V_2O_5/Nb_2O_5$ | | |
|---|---|---|---|
| A | (88.90, | 2.22, | 8.88) |
| B | (55.00, | 43.00, | 2.00) |
| C | (46.50, | 51.50, | 2.00) |
| D | (11.11, | 80.00, | 8.89) |
| E | (37.50, | 5.00, | 57.50) |
| F | (49.49, | 45.46, | 5.05) |
| G | (11.11, | 80.00, | 8.89) |
| H | (42.81, | 22.94, | 34.25) |
| I | (47.64, | 46.12, | 6.24) |
| J | (27.01, | 64.69, | 8.30) |
| K | (36.71, | 37.97, | 25.32) |
| L | (44.05, | 32.97, | 22.98) |
| M | (45.36, | 46.45, | 8.19) |
| N | (32.89, | 57.05, | 10.06) |
| O | (36.71, | 44.30, | 18.99) |
| P | (44.95, | 40.54, | 14.51) |

PREFERRED EMBODIMENT OF THE INVENTION

It is necessary that the present thin film of lithium niobate single crystal is formed on a lithium tantalate substrate and that their crystal lattices are matched, because the thin film of lithium niobate single crystal thus formed comes to have extremely excellent optical properties and a sufficient film thickness which has never been attained by the prior art by virtue of the lattice matching achieved therebetween. The reason why the thin film of lithium niobate single crystal comes to have extremely excellent optical properties is that the thin film of lithium niobate single crystal and the lithium tantalate substrate are unified by the lattice matching to provide a high-quality thin film having excellent crystallinity with very little lattice strain or defect, free from microcracks.

It has been impossible to form a thin film whose crystal lattice is matched with that of the substrate by the conventional techniques, and thus the resulting thin film suffers poor crystallinity, and microcracks are observed therein. Accordingly, even if the surface of the substrate material and that of the thin film are made smooth by lapping or chemical etching, or if high-purity materials (content of impurity is low) are used, so as to reduce the scattering loss at the interface with the substrate or at the surface of the thin film, as well as, the absorption loss to be caused by the impurity content to some extents, the absorption/scattering loss at the crystal grain boundary or the scattering loss to be caused by microcracks will be great to increase propagation loss, preventing the thin film from being offered for optical applications.

While the means for achieving lattice matching between the thin film of lithium niobate single crystal and the lithium tantalate substrate is not particularly limited in this invention, the lattice constant of the thin film of lithium niobate to be formed on the lithium tantalate substrate is made greater than that of the substrate, if the a-axis lattice constant of the lithium tantalate is greater than that of the ordinary lithium niobate (5.148 Å). As a means for increasing the lattice constant of lithium niobate, it is advantageous to incorporate hetero elements, preferably sodium and magnesium into the thin film of lithium niobate single crystal. The reason why the incorporation of sodium and magnesium is advantageous is that sodium and magnesium ions or atoms have the effect of increasing the lattice constant (a-axis) of lithium niobate by incorporating them by substitution into the crystal lattice of lithium niobate or by doping. Lattice matching between the lithium tantalate substrate and the lithium niobate single crystal can be facilitated by adjusting the amounts of sodium and magnesium. Sodium is particularly useful to greatly increase the lattice constant of lithium niobate. Although magnesium can also increase the lattice constant of lithium niobate, its effect is not so great as sodium but has an important effect of preventing optical damage. When sodium and magnesium are incorporated in the thin film of lithium niobate single crystal, desirably the content of sodium is 0.1 to 14.3 mol %, preferably 0.3 to 4.8 mol %, and that of magnesium is 0.8 to 10.8 mol %, preferably, 3.5 to 8.6 mol %, relative to the lithium niobate single crystal. The reason is that if the content of sodium is less than 0.1 mol %, the lattice constant of the thin film may not be increased sufficiently so as to allow lattice matching with the lithium tantalate substrate regardless of the amount of the magnesium to be incorporated; whereas if the content of sodium is more than 14.3 mol %, the lattice constant thereof will be too great, and thus lattice matching cannot be achieved in both cases.

On the other hand, if the content of magnesium is less than 0.8 mol %, the effect of preventing optical damage may not sufficiently be exhibited; whereas if it is more than 10.8 mol %, magnesium niobate system crystals precipitate undesirably.

The relationship between the Na content and the a-axis lattice constant of lithium niobate is as shown in FIG. 4.

Incorporation of sodium is as described in Journal of Crystal Growth Vol. 54 (1981), pp. 572–576, where sodium is incorporated to lithium niobate to form a sodium-containing thin film of lithium niobate single crystal having a film thickness of 20 μm on a Y-cut lithium niobate substrate by liquid phase epitaxial growth method; and in Journal of Crystal Growth, Vol. 84 (1987) pp. 409–412, where sodium is incorporated into lithium niobate to form a sodium-containing thin film of lithium niobate single crystal on a Y-cut lithium tantalate substrate by liquid phase epitaxial growth method. It is true, however, that these literatures describe incorporation of sodium into lithium niobate single crystal can modify its lattice constant, but the techniques are both for SAW (Surface Acoustic Wave) devices, and they refer neither to optical properties nor to the lattice matching of lithium niobate single crystal with the lithium tantalate substrate whereby to form a film having excellent optical properties. The thin films of lithium niobate single crystal described in these literatures are for SAW devices, and further the former method uses lithium niobate as the substrate, whereas in the latter method no lattice matching is achieved between the lithium tantalate substrate and the thin film formed thereon, although the thin film is formed on a lithium tantalate substrate. Therefore, both of them cannot be used as the desired optical material according to this invention.

The lattice constant of lithium niobate can otherwise be increased by modifying the Li/Nb molar ratio of the lithium niobate single crystal, as shown in FIG. 5.

It can be seen from FIG. 5 that the molar ratio of Li/Nb is preferably in the range of 41/59 to 56/44.

Alternatively, the a-axis lattice constant of lithium tantalate substrate may be reduced. In this case, titanium is incorporated as the hetero atom to the lithium tantalate. Titanium is added in an amount of 0.2 to 30 mol %, because the lattice matching of the substrate with the thin film of lithium niobate single crystal will be difficult if the titanium content is out of the specified range. Titanium may be diffused on the lithium tantalate substrate or added to the raw material composition to carry out crystal pulling by Czochralski method and molded into a form of substrate.

Otherwise, when a thin film of lithium niobate single crystal is subjected to lattice matching with a single crystal substrate having an a-axis lattice constant of greater than 5,148 Å, a hetero element is incorporated into the lithium niobate to reduce the lattice constant thereof.

When Ti is incorporated as the hetero atom, the a-axis lattice constant of lithium niobate changes as shown in FIG. 6. Titanium is incorporated suitably in an amount of 0.2 to 30 moles. In this invention, lithium tantalate is used as the substrate, and the substrate may not particularly be limited so long as it has a hexagonal crystal structure and an a-axis lattice constant of 5.128 to 5.173 Å. The form of substrate is not limited only to the flat plate.

The substrate material may typically be exemplified by ZnO, $Gd_3Ga_5O_{12}$, MgO and alumina, but lithium tantalate is particularly advantageously used. The reason why lithium tantalate is used is that the crystal system of lithium tantalate substrate is very similar to that of lithium niobate single crystal to facilitate epitaxial growth of the lithium niobate single crystal, and that high quality lithium tantalate substrates are always commercially available.

The lithium tantalate having an a-axis lattice constant in the range of 5.128 to 5.173 Å can be used as the substrate, and the shape thereof may be any of fiber and bulk.

The roughness of the surface of the lithium tantalate substrate on which a thin film of lithium niobate single crystal is to be formed is desirably $R_{max}$ = 10 to 1,000 Å according to JIS B0601, because it is extremely difficult to reduce the $R_{max}$ value below 10 Å, while the crystallinity of the thin film of lithium niobate single crystal will be lowered if the $R_{max}$ value exceeds 1,000 Å.

The thin film of lithium niobate single crystal according to this invention is formed on a lithium tantalate substrate, and the lithium tantalate substrate may contain a hetero element at least partly on the surface.

The reason why such hetero element is incorporated partly on the surface of lithium tantalate substrate is that it can greatly modify the refractive index of the substrate and thus the index difference between the substrate and the thin film waveguide layer can be increased. At least one hetero element selected from Mg, Ti, V, Cr, Fe, Ni and Nd is preferably used. As the way of increasing the difference between the refractive index of the thin-film waveguide layer and that of substrate, the refractive index of the lithium tantalate substrate may be reduced or that of the thin film of lithium niobate may be increased.

For such purposes, Mg or V is incorporated to the lithium tantalate substrate, while Ti, Cr, Fe, Ni or Nd can be incorporated to the thin film of lithium niobate, as the hetero atoms, respectively. Particularly for SHG oscillation, the difference between the refractive index of lithium tantalate substrate and that of the thin film of lithium niobate must be increased.

When the hetero element is incorporated into the lithium tantalate substrate, the hetero element may not uniformly be present throughout the substrate. In this invention, if a hetero element is incorporated into the lithium tantalate substrate at a specific portion so as to form a pattern of waveguide forming portion having a relatively low refractive index compared with that of non-forming portion, the thin film of lithium niobate single crystal formed on the pattern merely by depositing it in the form of slab on the substrate constitutes a waveguide. Accordingly, the step of securing a waveguide portion can be omitted.

As a way of reducing the refractive index of the waveguide forming portion of the substrate relative to the non-forming portion thereof, the refractive index of the waveguide forming portion of the substrate may be reduced or that of the non-forming portion thereof may be increased, desirably. If the hetero element is distributed nonuniformly on the substrate, a waveguide is formed only on the portion which conforms to the requirements for the waveguide.

The content of hetero element on the surface of the lithium tantalate substrate is desirably as follows:
Ti: 0.2 to 30 mol %
Cr: 0.02 to 20 mol %
Fe: 0.02 to 20 mol %
Ni: 0.02 to 20 mol %
Nd: 0.02 to 10 mol %
Mg: 0.1 to 20 mol %
V: 0.05 to 30 mol %

The above values were calculated according to the following formula:

$$\text{Hetero element}/(\text{LiTaO}_3 + \text{hetero element}) \times 100.$$

The respective contents of the hetero elements are more preferably as follows:
Ti: 1.0 to 15 mol %
Cr: 0.2 to 10 mol %
Fe: 0.2 to 10 mol %
Ni: 0.2 to 10 mol %
Nd: 0.5 to 5 mol %
Mg: 2.0 to 10 mol %
V: 1.0 to 15 mol %

The reason why the above formulation range are preferred is because the crystallinity of the substrate is lowered if the content of the hetero element is above the specified range, whereas if it is less than the specified range, the refractive index of the substrate cannot be modified.

Of the above hetero elements, those having an action of increasing the refractive index of the lithium tantalate substrate are Ti, Cr, Nd, Fe and Ni, while those having an action of reducing the refractive index thereof are Mg and V. These elements can be incorporated into the lithium tantalate substrate in various forms such as atom, ion and oxide.

Since these elements can modify the refractive index only at the surface of the substrate without substantially affecting the characteristics participating in the film formation on the substrate, e.g. surface roughness, thin films having properties equivalent to those of the ordinary substrates containing no hetero element can be formed under the same conditions.

It is particularly preferred in this invention to use the (0001) plane of the lithium tantalate substrate as the growth plane.

Figure 1:
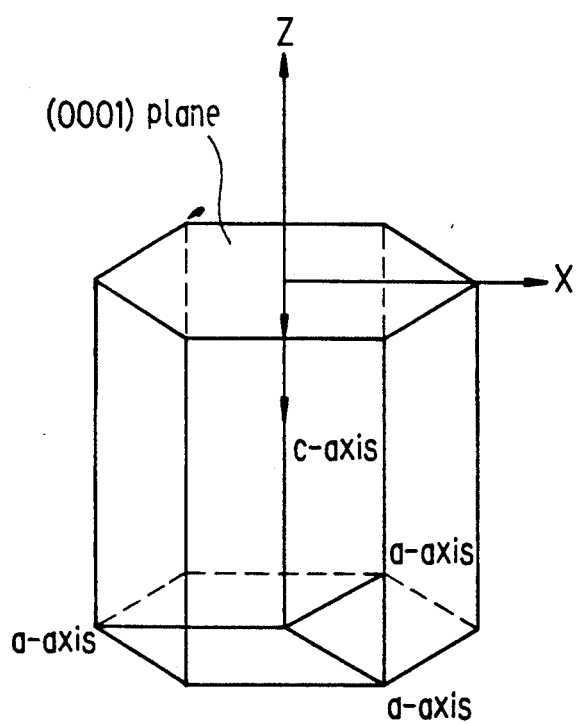
FIG. 1 shows schematically the (0001) plane of a lithium tantalate substrate which is the plane on which a thin film of lithium niobate single crystal is to be grown (hereinafter simply referred to as growth plane).
Figure 2:
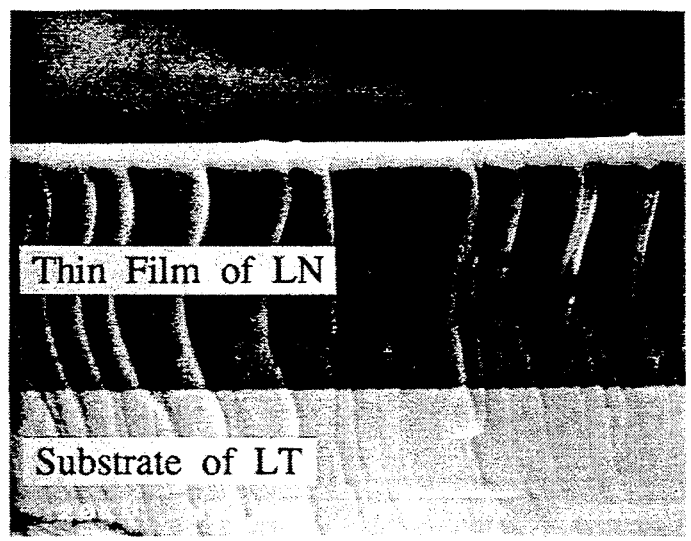
FIG. 2 SEM photograph of a broken section of the thin film of lithium niobate single crystal formed on a lithium tantalate single crystal substrate.

The (0001) plane of the lithium tantalate substrate means the plane which is perpendicular to the c-axis of lithium tantalate. The reason why it is preferred to use the (0001) plane of the lithium tantalate substrate as the growth plane is because lithium tantalate has a hexagonal crystal structure (see FIG. 1) and the (0001) plane consists only of a-axis, so that the lattice matching of the substrate with the thin film of lithium niobate single crystal can be achieved merely by modifying the a-axis lattice constant.

The thin film of lithium niobate single crystal according to this invention desirably shows a propagation loss in the range of more than 1.4 dB/cm and less than 30 dB/cm, more preferably less than 15 dB/cm. The propagation loss is measured by prism coupling method using an incident semiconductor laser beam having a wavelength of 0.83 μm.

The present inventors previously disclosed (see Japanese Patent Application No. 247179/1990) that the thin film of lithium niobate single crystal is required to show a propagation loss of not more than 1.4 dB/cm when it is used as various optical materials. However, as the result of their further study, they found that a propagation loss of less than 30 dB/cm is useful as an optical material. But if the propagation loss exceeds 30 dB/cm, the intended object of this invention cannot be achieved.

Propagation loss means the percentage of photometric reduction of light per unit length of the light traveling direction when the light is guided through the thin film, and it includes scattering loss and absorption loss. The scattering loss depends on the state of the interface between the substrate and the thin film, the surface state of the thin film and the microcracks present in the thin film.

On the other hand, the absorption loss is subject only to the properties of the thin film and depends on the crystallinity of the thin film and the content of impurities therein.

The lattice constant (a-axis) of the thin film of lithium niobate single crystal is desirably 99.81 to 100.07%, more suitably 99.92 to 100.03% of that of the lithium tantalate substrate.

For example, when the lattice constant of the lithium tantalate substrate is 5.153 Å, the lattice constant of thin film of lithium niobate single crystal is desirably 5.150 to 5.155 Å.

The reason is that if the lattice constant is out of the specified range, lattice matching between the lithium tantalate substrate and the thin film of lithium niobate single crystal will be difficult and therefore it will not be feasible to form a thin film of lithium niobate single crystal having a sufficient thickness as well as excellent optical properties so as to be used as optical materials.

The thickness of the thin film of lithium niobate signal crystal is preferably at least 5 μm, particularly preferably 10 μm or more.

The thin film of lithium niobate single crystal according to this invention desirably contains at least one element selected from chromium (Cr), neodymium (Nd), rhodium (Rh), zinc (Zn), nickel (Ni), cobalt (Co), titanium (Ti) and vanadium (V) so as to modify the optical properties thereof including refractive index, as necessary.

The content of each element is as follows:
Rh: 0.05 to 20 mol %
Zn: 0.02 to 30 mol %
Ni: 0.1 to 20 mol %
Co: 0.05 to 20 mol %
Cr: 0.02 to 20 mol %
Ti: 0.2 to 30 mol %
Nd: 0.02 to 10 mol %
V: 0.05 to 30 mol %.

The content of each element is more preferably as follows:
Rh: 0.1 to 10 mol %
Zn: 0.5 to 15 mol %
Ni: 1.0 to 10 mol %
Co: 0.1 to 10 mol %
Cr: 0.2 to 10 mol %
Ti: 1.0 to 15 mol %
Nd: 0.5 to 5 mol %
V: 1 0 to 15 mol %.

While the content of each hetero element is shown in terms of mol % relative to lithium niobate single crystal, addition of such hetero element in an amount of below its lower limit is meaningless since it causes small or almost no change in the refractive index; whereas addition of such hetero element in an amount of above the upper limit causes to lower not only the crystallinity of the lithium niobate single crystal but also the optical properties of the thin film of lithium niobate single crystal.

By the way, when a hetero element such as Cr, Nd, Ti, V, Rh, Zn, Ni and Co is incorporated in the thin film of lithium niobate single crystal, it is desirable to adjust the content thereof, as necessary, since the lattice constant and refractive index of the thin film of lithium niobate single crystal simultaneously shift.

Determination of lattice constant is carried out by means of ordinary X-ray powder diffractometry in this invention.

The lattice constant is calculated using 20 values of 15 peaks in lithium niobate detected at Cu - $2\theta = 45°$ to $90°$ and the plane index thereof according to least squares method. In this measurement, Si is used as an internal standard.

When the thin film of lithium niobate single crystal of this invention is used in a SHG device, it is desired that the refractive index of ordinary ray $n_o$ and the refractive index of extraordinary ray $n_e$ of the thin film of lithium niobate single crystal are respectively in the range of $2.25 \leq n_o \leq 2.40$ and $2.0 \leq n_e \leq n_o - 0.01$ against a laser beam source having a wavelength of 0.83 μm (fundamental wavelength), and that the refractive index of extraordinary ray $n_e$ against the second harmonic (0.415 μm) generated is smaller than the refractive index of ordinary ray $n_o$ against the second harmonic.

Next, the process for forming the thin film of lithium niobate single crystal according to this invention will be described.

As the process for forming the thin film of lithium niobate single crystal according to this invention, liquid phase epitaxial growth, sputtering, vapor deposition, MOCVD and CVD are desirably used, and particularly preferably liquid phase epitaxial growth is used.

The reason why liquid phase epitaxial growth method is preferred is that it allows easy formation of uniform films having excellent crystallinity, and thus thin films of lithium niobate single crystal with small propagation loss which can suitably be used as optical waveguides can be formed without impairing the excellent properties of the lithium niobate single crystal such as nonlinear optical effect, electrooptical effect and acoustic optical effect. The film can be formed at high productivity.

In order to give a high-quality crystals, the liquid phase epitaxial growth is desirably carried out by bringing a lithium tantalate substrate into contact with a melt containing $Li_2O$, $Nb_2O_5$, $V_2O_5$, $Na_2O$, $MgO$, etc. to effect liquid phase epitaxial growth of a thin film of lithium niobate single crystal while the a-axis constant of the lithium tantalate substrate is matched with that of the thin film of lithium niobate single crystal. Na and Mg have the effect of increasing the lattice constant of the thin film of lithium niobate single crystal, and further Mg has an effect of preventing optical damage.

To describe now the composition range of $Li_2O$, $V_2O_5$ and $Nb_2O_5$ excluding $Na_2O$ and $MgO$ referring to the triangular map of the $Li_2O$-$V_2O_5$-$Nb_2O_5$ ternary system, it is advantageously in the region surrounded by the five points of composition A (88.90, 2.22, 8.88), B (55.00, 43.00, 2.00), C (46.50, 51.50, 2.00), D (11.11, 80.00, 8.89) and E (37.50, 5.00, 57.50).

The parenthesized values of the respective points of composition are shown in terms of mol % in the order of $Li_2O$, $V_2O_5$ and $Nb_2O_5$.

The advantage of such composition range is that the lattice matching between the thin film of lithium niobate single crystal and the lithium tantalate substrate can be facilitated by the magnesium and sodium incorporated, providing a high-quality thin film of lithium niobate single crystal having excellent optical properties with particularly low propagation loss.

Further the composition range of $Li_2O$, $V_2O_5$ and $Nb_2O_5$ excluding $Na_2O$ and $MgO$ referring to the triangular map of the ($Li_2O$-$V_2O_5$-$Nb_2O_5$) ternary system, it is advantageously in the region surrounded by the three points of composition F (49.49, 45.46, 5.05), G (11.11, 80.00, 8.89) and H (42.81, 22.94, 34.25), preferably by the four points I (47.64, 46.12, 6.24), J (27.01, 64.69, 8.30), K (36.71, 37.97, 25.32) and L (44.05, 32.97, 22.98), most preferably by the four points M (45.36, 46.45, 8.19), N (32.89, 57.05, 10.06), 0 (36.71, 44.30, 18.99) and P (44.95, 40.54, 14.51).

The composition ratio of $Na_2O/Li_2O$ in this invention is desirably 2.0/98.0 to 93.5/6.5 in terms of molar ratio.

The reason is because if the amount of $Na_2O$ incorporated is out of the specified range, it is difficult to achieve lattice matching between the lithium tantalate substrate and the thin film of lithium niobate single crystal.

The composition ratio of $Na_2O/Li_2O$ in this invention is more desirably 7.4/92.6 to 80.0/20.0, most suitably 16.7/83.3 to 48.4/51.6 in terms of molar ratio.

The composition ratio of $MgO/LiNbO_3$ (theoretical value of lithium niobate precipitatable from the melt composition) is desirably 0.1/99.9 to 25.0/75.0 in terms of molar ratio. The reason is because if the proportion of MgO is less than the specified range, the optical damage preventive effect of Mg will be exhibited insufficiently; whereas if it is more than the specified range, magnesium niobate system crystals precipitate to prevent formation of thin film of lithium niobate single crystal.

The composition ratio of $MgO/LiNbO_3$ in this invention is more desirably 0.7/100 to 9.0/100, most suitably 3.5/100 to 6.0/100 in terms of molar ratio.

Particularly in the composition range where $Li_2O/Nb_2O_5 > 1$, the molar ratio of $MgO/Nb_2O_5$ is desirably 0.2/99.8 to 40.0/60.0.

The composition ratio of $MgO/Nb_2O_5$ is more desirably 0.7/50.0 to 9.0/50.0, particularly suitably 3.5/50.0 to 6.0/50.0 in terms of molar ratio.

It is also preferred to incorporate a hetero element to the substrate at least partially on the surface layer, prior to formation of a thin film of lithium niobate single crystal having its lattice constant matched with that of the lithium tantalate substrate. The way of incorporating such hetero element includes liquid phase epitaxial growth or incorporation of hetero element in advance into the raw material of lithium tantalate bulk single crystal, as well as, heat diffusion method, ion exchange method and ion implantation method.

In the heat diffusion method, a compound containing a hetero element (usually an oxide) is sputtered onto the surface of a substrate and the hetero element is diffused by heating from the surface of the substrate. In the ion exchange method, a substrate is impregnated with a melt of a compound containing a hetero element to replace the Li ion around the surface of the substrate with the hetero element. In the ion implantation method, a compound containing a hetero element is volatilized and accelerated under an electric field to be allowed to impinge directly onto the substrate surface. In the raw material incorporation method, a hetero element is added to the raw materials to carry out crystal pulling by Czochralski method, wherein the seed crystal is preferably rotated in contact with the melt of raw materials.

While a hetero element diffusion layer is formed when any of the heat diffusion, ion exchange and ion implantation methods is used, the diffusion layer desirably has a thickness of 0.005 to 20 μm. If the diffusion layer has a thickness of less than 0.005 μm, the proportion of the light guided therethrough and diffused to the portion of the substrate with no hetero element diffused therein will be too great to satisfy the refractive index to be required for the substrate; whereas if it has a thickness of more than 20 μm, the crystallinity thereof will be reduced. Particularly when MgO is diffused, the thickness of the diffusion layer is preferably 250 to 1,000 Å.

The substrate is desirably heated to effect heat diffusion of the hetero element and then brought into contact with a melt for liquid phase epitaxial growth with continuous heating.

The reason why such continuous heating is necessary is because the crystallinity of the substrate is reduced if the substrate is once cooled after completion of heat diffusion and then heated again for carrying out liquid phase epitaxial growth. The heat diffusion is preferably carried out when the substrate is preheated in the same oven in which the melt is heated.

The heat diffusion is preferably carried out at 850° to 1,050° C.

If the heat diffusion temperature is lower than 850° C., the hetero elements may not be diffused; whereas if it is higher than 1,050° C., not only the crystallinity of the substrate will be lowered but also external diffusion of lithium will occur.

The time required for the heat diffusion is desirably 0.25 to 20 hours.

In the process of this invention, the substrate is desirably preheated before it is brought into contact with the melt, since lithium tantalate substrate is very susceptible to thermal shock.

The preheating time is desirably 5 to 120 minutes.

The preheating is desirably carried out at the height of 5 to 15 mm from the surface of the melt.

The raw material components of the melt according to this invention are desirably of oxides or compounds which can be converted into oxides by heating, for example, compositions of $Na_2CO_3$, $Nb_2O_5$, $Li_2CO_3$, $V_2O_5$, MgO, $NaNbO_3$, $NaVO_3$, $LiNbO_3$ and $LiVO_3$, all of which are preferably of optical grade.

The above raw material components are desirably heat-melted at 600° to 1,300° C. in an aerobic or oxidative condition. In the liquid phase epitaxial method, the melt is supercooled first and then brought into contact with the lithium tantalate substrate to effect crystal growth.

The cooling rate for supercooling the melt is desirably 0.5° to 300° C./hour.

In this invention, the melt is desirably cooled at the rate of 0.5° to 1,200° C./hour after completion of the liquid phase epitaxial growth. The above cooling is preferably carried out exponentially from 400° C.

At the Curie point of the lithium tantalate substrate, the melt is maintained at this temperature for a predetermined time or cooled at a rate of 0.1° to 5° C./min.

The reason is because cracking which may occur concomitantly with the phase transition of crystal at the Curie point can be prevented.

While the Curie point of the lithium tantalate substrate can be shifted by incorporating hetero elements thereto, it is generally 650° C.

The temperature for the liquid phase epitaxial growth is desirably in the range of 600° to 1,250° C. If the temperature is higher than the specified range, no crystal will precipitate since the melting point of lithium niobate is 1,250° C.; whereas if it is lower than the specified range, the raw materials cannot be melted since the flux has a melting point of 600° C.

The lithium tantalate substrate is desirably rotated whe the liquid phase epitaxial growth is carried out, since such rotation of lithium tantalate substrate allows growth of crystal having uniform properties and film thickness.

The rotation of substrate is desirably carried out on a horizontal plane and advantageously at a rate of 50 to 150 rpm.

The lithium tantalate substrate is desirably subjected to optical lapping at least on the growth surface, followed by chemical etching.

Further, the edges of the substrate are desirably chamfered.

If the edges are not chamfered, fine flaws may be formed at the edges and cracking readily occurs from these flaws when exposed to thermal shock. The chamfered edges may be by rounding or beveling.

The lithium tantalate substrate desirably has a thickness of 0.5 to 2.0 mm.

If the substrate has a thickness of less than 0.5 mm, cracking easily occurs; whereas if it has a thickness of more than 2.0 mm, it will suffer pyroelectric effect (discharge effect caused by heating) since it is electrified by heating or lapping to attract lapping waste which easily forms scratches on the surface of the substrate.

The thickness of the thin film of lithium niobate single crystal to be precipitated on the lithium tantalate substrate according to this invention can be controlled by suitably selecting the time for contacting the lithium tantalate substrate with the melt and the temperature of the melt.

The rate of growing the thin film of lithium niobate single crystal according to this invention is desirably 0.01 to 1.0 $\mu m/min$.

If the growing rate is higher than the specified range, the thin film of lithium niobate single crystal comes to have waviness; whereas if it is lower than the specified range, growth of the thin film takes too much time.

It is desired in this invention to remove the flux from the surface of the lithium tantalate substrate and that of the thin film of lithium niobate single crystal after completion of the liquid phase epitaxial growth.

Any residual flux on the surface causes the film to have nonuniform thickness.

The flux can advantageously be removed by spinning the thin film of lithium niobate single crystal formed on the lithium tantalate substrate at a rate of 100 to 10,000 rpm.

The rotation time is preferably 5 to 60 minutes.

The melt is desirably stirred for 6 to 48 hours using an appropriate stirring procedure. If the melt is not sufficiently stirred, crystal nuclei remain undissolved in the melt and crystals grow around these nuclei to form an irregular surface on the thin film of lithium niobate single crystal. The surface roughness of the thin film of lithium niobate single crystal is $R_{max}=0.001$ to $0.1$ $\mu m$ according to JIS B0601.

In this invention, oxides of elements selected from Nd, Rh, Zn, Ni, Co and Ti can be used as the melt components in addition to $Nb_2O_5$, $V_2O_5$, $Li_2O$, $Na_2O$ and MgO.

As a way for achieving lattice matching of the lithium tantalate substrate with the thin film of lithium niobate single crystal by modifying the molar ratio of Li/Nb, the liquid phase epitaxial growth method using a melt composition containing at least $K_2O$, $V_2O_5$, $Li_2O$ and $Nb_2O_5$ is advantageous.

The reason for the above will now be described.

$K_2O$ and $V_2O_5$ serve as a flux. The use of $K_2O$ and $V_2O_5$ as the flux can prevent supply of Li from the flux, so that the ratio of Li/Nb in the thin film of lithium niobate single crystal to be precipitated can be changed by modifying the composition ratio of $Li_2O$ to $Nb_2O_5$ in the raw material composition.

Since the a-axis lattice constant changes if the Li/Nb ratio is changed, the a-axis lattice constant of thin film of lithium niobate single crystal can be controlled by controlling the composition ratio of $Li_2O/Nb_2O_5$ in the raw material composition, whereby the lattice matching between the thin film of lithium niobate single crystal and lithium tantalate substrate can be achieved.

Further, $Na_2O$ and MgO may be added to the melt consisting of $K_2O$, $V_2O_5$, $Li_2O$ and $Nb_2O_5$.

The reason for the addition of MgO and $Na_2O$ is that it can increase the a-axis lattice constant of the thin film of lithium niobate single crystal, and MgO can further prevent optical damage.

The molar composition ratio of $Li_2O/Nb_2O_5$ in the melt is desirably 43/57 to 56/44, more preferably 43/57 to 50/50.

The reason is because the crystal structure of the lithium niobate single crystal to be precipitated will be changed to deteriorate the optical properties thereof if the molar ratio is not within the above range.

It is further desired that MgO is added in such an amount that the theoretical value of the lithium niobate single crystal precipitatable from the composition of MgO/raw materials may satisfy 30/100 in terms of molar ratio.

The reason is because magnesium niobate system crystals precipitate if the amount of MgO exceeds the above value.

The composition of $K_2O$ and $V_2O_5$ is desirably in such a range that the theoretical value of the lithium niobate single crystal precipitatable from the composition of $K_2O/V_2O_5$ flux (in terms of $KVO_3$)/raw materials satisfies a molar ratio of 25/75 to 75/25.

The reason is because the crystal structure of the lithium niobate single crystal to be precipitated will be changed to deteriorate the optical properties thereof if a molar ratio of the flux is not within the above range.

The molar composition ratio of $K_2O/V_2O_5$ is advantageously 1:1.

In this invention, lattice matching can be achieved by adjusting the a-axis lattice constant of the lithium tantalate substrate by adding a hetero element thereto so as to match it with that of the lithium niobate single crystal.

The lithium tantalate substrate is desirably manufactured by CZ (Czochralski) method.

Lithium carbonate, tantalum pentaoxide, titanium oxide and vanadium pentaoxide can be mentioned as the raw materials.

These raw materials are advantageously heat-melted in an iridium crucible or a platinum-rhodium crucible to pull lithium tantalate single crystals. Use of iridium crucible is more preferred since it scarcely allows migration of impurities into the crystal.

The a-axis lattice constant of the lithium tantalate substrate can be increased by incorporating a hetero element such as sodium.

It is further preferred to modify the a-axis lattice constant of thin film of lithium niobate single crystal and that of lithium tantalate substrate simultaneously to effect lattice matching.

It is also desired in this invention to incorporate titanium in the thin film of lithium niobate single crystal when the film is subjected to lattice matching with a hexagonal single crystal substrate having an a-axis lattice constant of 5.128 to 5.150 Å.

In order to achieve such matching between the a-axis lattice constant of the thin film of lithium niobate single crystal and that of the lithium tantalate substrate, a composition mainly containing $Li_2O$, $V_2O_5$, $Nb_2O_5$ and $TiO_2$ is desirably used as the melt, and a substrate is contacted with the melt to effect liquid phase epitaxial growth of crystals and matching of their a-axis constants.

To describe now the composition ratio of $Li_2O/V_2O_5/Nb_2O_5$ referring to the triangular map of the $Li_2O$-$V_2O_5$-$Nb_2O_5$ ternary system, it is desirably in the region surrounded by the five points of composition A (88.90, 2.22, 8.88), B (55.11, 43.00, 2.00), C (46.50, 51.50, 2.00), D (11.11, 80.00, 8.89) and E (37.50, 5.00, 57.50).

The amount of $TiO_2$ is advantageously in the range of 0.2 to 60 mol % relative to the theoretical amount of lithium niobate single crystal precipitatable from the melt composition.

By the way, in order to use the lithium niobate single crystal as a constituent of optical devices including SHG devices, it is required to have optically useful properties such as electrooptical effect and nonlinear optical effect.

In order that lithium niobate or lithium tantalate single crystal may have optically useful properties such as electrooptical effect and nonlinear optical effect, the crystal must be subjected to poling by applying an electric field with heating to a temperature not lower than the Curie point during the manufacturing process.

On the other hand, it is known that single crystals of lithium niobate and lithium tantalate containing hetero elements cannot easily be subjected to poling.

However, the present thin film of lithium niobate single crystal is always polarized no matter how the lithium tantalate substrate is polalized or electrically neutralized by polaritic inversion and can show various properties such as excellent electrooptical effect and nonlinear optical effect.

Accordingly, it is an advantage of this invention that the production process can be simplified because the thin film of lithium niobate single crystal and the lithium tantalate substrate need no poling process, and therefore those lithium tantalate substrates containing hetero elements which have been used with difficulty in the prior art can be employed.

This invention will be described more specifically by way of Examples.

EXAMPLE 1

(1) Into a platinum crucible was introduced a mixture of 22 mol % of $Na_2CO_3$, 28 mol % of $Li_2CO_3$, 40 mol % of $V_2O_5$, 10 mol % of $Nb_2O_5$ and MgO in an amount of 2 mol % added per theoretical amount of $LiNbO_3$ precipitatable from the melt composition, and the mixture in the crucible was melted by heating to 1,100° C. in an epitaxial growth apparatus under aerobic conditions.

The melt was further stirred using a propeller at a speed of 100 rpm for 12 hours.

(2) A 2 mm thick lithium tantalate single crystal was subjected to optical lapping and then chemical etching, on the (0001) plane, followed by chamfering (rounding). The thus obtained substrate had a surface roughness of $R_{max}=100$ Å as measured according to JIS B0601.

After the melt was gradually cooled to 915° C. at a cooling rate of 60° C./hour, the substrate was preheated at 915° C. for 30 minutes and then immersed in the melt under rotation at 100 rpm for 8 minutes. A thin film of lithium niobate was formed at a growing rate of 1 μm/min.

(3) The substrate material was drawn up from the melt and further rotated at 1,000 rpm above the melt for 30 seconds to fling off the unnecessary portion of melt therefrom. The substrate material was then gradually cooled to room temperature at a rate of 1° C./min to form a Na/Mg containing thin film of lithium niobate single crystal having a thickness of about 8 μm on the substrate material.

(4) The amounts of sodium and magnesium contained in the thin film of lithium niobate single crystal were 3 mol % and 2 mol %, respectively. The thus obtained thin film had a lattice constant (a-axis) of 5.156 Å and a refractive index of 2.235±0.001 as measured at an incident light wavelength of 1.15 μm.

The thin film of lithium niobate had a surface roughness of $R_{max}=1,000$ Å as measured according to JIS B0601.

EXAMPLE 2

(1) Into a platinum crucible was introduced a mixture of 50 mol % of $Li_2CO_3$, 40 mol % of $V_2O_5$, 10 mol % of $Nb_2O_5$, $Na_2CO_3$ in an amount of 47 mol % added per theoretical amount of $LiNbO_3$ precipitatable from the melt composition and MgO in an amount of 7 mol % added per theoretical amount of $LiNbO_3$ precipitatable from the melt composition, and the mixture in the crucible was melted by heating to 1,100° C. in an epitaxial growth apparatus under aerobic conditions.

The melt was further stirred using a propeller at a speed of 100 rpm for 6 hours.

(2) A 1.5 mm thick lithium tantalate single crystal was subjected to optical lapping and then chemical etching, on the (0001) plane, followed by chamfering (beveling, C=0.01 mm, JIS B0701).

The thus obtained substrate material had a surface roughness of $R_{max}=170$ Å as measured according to JIS B0601.

After the melt was gradually cooled to 922° C. at a cooling rate of 60° C./hour, the substrate was preheated at 922° C. for 10 minutes and then immersed in the melt under rotation at 100 rpm for 23 minutes.

A thin film of lithium niobate was formed at a growing rate of 1.65 μm/min.

(3) The substrate material was drawn up from the melt and further rotated at 1,000 rpm above the melt for 30 seconds to fling off the unnecessary portion of melt therefrom. The substrate material was then gradually cooled to the Curie point of the lithium tantalate single crystal at a cooling rate of 300° C./hour, and after the substrate was maintained at this temperature for 1 hour, it was further cooled to room temperature at a cooling rate of 60° C./hour to form a Na/Mg containing thin film of lithium niobate single crystal having a thickness of about 38 μm on the substrate material.

(4) The amounts of sodium and magnesium contained in the thin film of lithium niobate single crystal were 2 mol % and 6 mol %, respectively. The thus obtained thin film had a lattice constant (a-axis) of 5.155 Å and a refractive index of 2.231±0.001 as measured at an incident light wavelength of 1.15 μm.

The thin film of lithium niobate had a surface roughness of $R_{max}=1,000$ Å as measured according to JIS B0601.

EXAMPLE 3

(1) Into a platinum crucible was introduced a mixture of 12.8 mol % of $Na_2CO_3$, 40 mol % of $V_2O_5$, 10 mol % of $Nb_2O_5$, 7.2 mol % of $Li_2CO_3$ and MgO in an amount of 5 mol % added per theoretical amount of $LiNbO_3$ precipitatable from the melt composition, and the mixture in the crucible was melted by heating to 1,100° C. in an epitaxial growth apparatus under aerobic conditions.

The melt was further stirred using a propeller at a speed of 150 rpm for 20 hours.

(2) A 1 mm thick lithium tantalate substrate was subjected to chamfering (rounding, R=0.5 mm, JIS B0701), and a 250 Å thick MgO layer was formed thereon by RF sputtering, followed by heat diffusion at 940° C. to form a diffusion layer having a thickness of 250 Å. The refractive index of the substrate dropped by 0.015 compared with that of the MgO-undiffused substrate. The substrate had a surface roughness of $R_{max}=170$ Å as measured according to JIS B0601.

(3) After the melt was gradually cooled to 938° C. at a cooling rate of 60° C./hour, the substrate was preheated at 938° C. for 50 minutes and then immersed in the melt under rotation at 100 rpm for 20 minutes. A thin film of lithium niobate was formed at a growing rate of 0.7 μm/min.

(4) The substrate material was drawn up from the melt and further rotated at 1,000 rpm above the melt for 30 seconds to fling off the unnecessary portion of melt therefrom. The substrate material was then gradually cooled to room temperature at a rate of 1° C./min to form a Na/Mg containing thin film of lithium niobate single crystal having a thickness of about 14 μm on the substrate material.

(5) The amounts of sodium and magnesium contained in the thin film of lithium niobate single crystal were 1 mol % and 6 mol %, respectively. The thus obtained thin film had a lattice constant (a-axis) of 5.153 Å and a refractive index of 2.231±0.001 as measured at an incident light wavelength of 1.15 μm.

The thin film of lithium niobate had a surface roughness of $R_{max}=1,400$ Å as measured according to JIS B0601.

EXAMPLE 4

(1) Into a platinum crucible was introduced a mixture of 12 mol % of $Na_2CO_3$, 38.0 mol % of $Li_2CO_3$, 40.0 mol % of $V_2O_5$, 10.0 mol % of $Nb_2O_5$, and $Nd_2O_3$ in amount of 0.8 mol % added per theoretical amount of $LiNbO_3$ precipitatable from the melt composition, and the mixture in the crucible was melted by heating to 1,100° C. in an epitaxial growth apparatus under aerobic conditions.

The melt was further stirred using a propeller at a speed of 80 rpm for 15 hours.

(2) A 0.5 mm thick lithium tantalate single crystal was subjected to optical lapping and then chemical etching, on the (0001) plane, followed by chamfering (rounding, R= 0.005 mm, JIS B0701).

The substrate had a surface roughness of $R_{max}=100$ Å as measured according to JIS B0601. After the melt was gradually cooled to 930° C. at a cooling rate of 60° C./hour, the substrate was preheated at 930° C. for 30 minutes and then immersed in the melt under rotation at 100 rpm for 7 minutes. A thin film of lithium niobate was formed at a growing rate of 0.7 μm/min.

(3) The substrate material was drawn up from the melt and further rotated at 1,000 rpm above the melt for 30 seconds to fling off the unnecessary portion of melt therefrom. The substrate material was then rapidly cooled to 600° C. at a cooling rate of 1200° C./hour and then gradually to room temperature at a rate of 60° C./hour to form a Na/Nd containing thin film of lithium niobate single crystal having a thickness of about 4.9 μm on the substrate material.

(4) The amounts of sodium and neodymium contained in the thin film of lithium niobate single crystal were 1.3 mol % and 0.4 mol %, respectively. The thus obtained thin film had a lattice constant (a-axis) of 5.153 Å, a refractive index of 2.232±0.001 as measured at an incident light wavelength of 1.15 μm.

The thin film of lithium niobate had a surface roughness of $R_{max}=2,000$ Å as measured according to JIS B0601.

EXAMPLE 5

(1) Into a platinum crucible was introduced a mixture of 25.8 mol % of $Na_2CO_3$, 24.2 mol % of $Li_2CO_3$, 40.0 mol % of $V_2O_5$, 10.0 mol % of $Nb_2O_5$ and $TiO_2$ in an amount of 12.0 mol % added per theoretical amount of $LiNbO_3$ precipitatable from the melt composition, and the mixture in the crucible was melted by heating to 1,100° C. in an epitaxial growth apparatus under aerobic conditions.

The melt was further stirred using a propeller at a speed of 100 rpm for 6 hours.

(2) A lithium tantalate single crystal was subjected to optical lapping and then chemical etching, on the (0001) plane, to provide a 0.9 mm thick substrate, followed by chamfering (rounding, R=0.1 mm, JIS B0701). The substrate had a surface roughness of $R_{max}=100$ Å as measured according to JIS B0601. After the melt was gradually cooled to 898° C. at a cooling rate of 60° C./hour, the substrate was preheated at 898° C. for 20 minutes and then immersed in the melt under rotation at 100 rpm for 9 minutes. A thin film of lithium niobate was formed at a growing rate of 0.78 μm/min.

(3) The substrate material was drawn up from the melt and further rotated at 1,000 rpm above the melt for 30 seconds to fling off the unnecessary portion of melt therefrom. The substrate material was then gradually cooled to room temperature at a cooling rate of 120° C./hour to form a Na/Ti containing thin film of lithium niobate single crystal having a thickness of about 7 μm on the substrate material.

(4) The amounts of sodium and titanium contained in the thin film of lithium niobate single crystal were 4.6 mol % and 5.0 mol %, respectively. The thus obtained thin film had a lattice constant (a-axis) of 5.153 Å and a refractive index of 2.241±0.001 as measured at an incident light wavelength of 1.15 μm.

The thin film of lithium niobate had a surface roughness of $R_{max}=1,000$ Å as measured according to JIS B0601.

EXAMPLE 6

(1) Into a platinum crucible was introduced a mixture of 19 mol % of $Na_2CO_3$, 31 mol % of $Li_2CO_3$, 40 mol % of $V_2O_5$, 10 mol % of $Nb_2O_5$ and MgO in an amount of 2 mol % added per theoretical amount of $LiNbO_3$ precipitatable from the melt composition, and the mixture in the crucible was melted by heating to 1,100° C. in an epitaxial growth apparatus under aerobic conditions.

(2) The melt was gradually cooled to 916° C. at a cooling rate of 60° C./hour. A lithium tantalate single crystal was subjected to optical lapping on the (0001) plane and chamfering (beveling, C=0.7 mm, JIS B0701), and then a vanadium film having a thickness of 500 Å was formed by RF sputtering, followed by heat diffusion at 970° C. to form a 500 Å diffusion layer and then chemical etching to provide a substrate material. The substrate had a surface roughness of $R_{max}=300$ Å as measured according to JIS B0601.

The refractive index of ordinary ray of the substrate material dropped by $1\times10^{-3}$ compared with that of the vanadium-undiffused substrate. The substrate material was immersed in the melt under rotation at 100 rpm for 15 minutes. A thin film of lithium niobate was formed at a growing rate of 0.60 μm/min.

(3) The substrate material was drawn up from the melt and further rotated at 1,000 rpm above the melt for 30 seconds to fling off the unnecessary portion of melt therefrom. The substrate material was then gradually cooled to room temperature at a cooling rate of 1° C./min to form a Na/Mg containing thin film of lithium niobate single crystal having a thickness of about 9 μm on the substrate material.

(4) The amounts of sodium and magnesium contained in the thin film of lithium niobate single crystal were 3 mol % and 2 mol %, respectively. The thus obtained thin film had a lattice constant (a-axis) of 5.156 Å, and a refractive index of 2.235±0.001 as measured at an incident light wavelength of 1.15 μm.

The thin film of lithium niobate had a surface roughness of $R_{max}=1,000$ Å as measured according to JIS B0601.

EXAMPLE 7

(1) Into an iridium crucible was introduced a mixture of 50 mol % of $Li_2CO_3$, 40 mol % of $V_2O_5$, 10 mol % of $Nb_2O_5$, $Na_2CO_3$ in an amount of 43 mol % added per theoretical amount of $LiNbO_3$ precipitatable from the melt composition and MgO in an amount of 7 mol % added per theoretical amount of $LiNbO_3$ precipitatable from the melt composition, and the mixture in the crucible was melted by heating to 1,100° C. in an epitaxial growth apparatus under aerobic conditions.

The melt was further stirred using a propeller at a speed of 200 rpm for 12 hours.

(2) The melt was gradually cooled to 915° C. at a cooling rate of 60° C./hour. A lithium tantalate single crystal was subjected to optical lapping on the (0001) plane to provide a thickness of 1.8 mm, followed by chamfering (beveling).

After an MgO film having a thickness of 1,000 Å and a width of 5 μm was formed by photolithography and RF sputtering, followed by heat diffusion at 920° C. to provide a substrate material having a MgO diffusion channel with a thickness of 1,000 Å and a width of 5 μm. The diffusion layer had a thickness of 1,000 Å.

The refractive index of ordinary ray of the channel dropped by $15\times10^{-3}$ compared with that of the MgO-undiffused portion. The substrate had a surface roughness of $R_{max}=300$ Å as measured according to JIS B0601. After the substrate material was preheated at 915° C. for 30 minutes, it was immersed in the melt under rotation at 100 rpm for 17 minutes. A thin film of lithium niobate was formed at a growing rate of 1.94 μm/min.

(3) The substrate material was drawn up from the melt and further rotated at 1,000 rpm above the melt for 30 seconds to fling off the unnecessary portion of melt therefrom. The substrate material was then gradually cooled to the Curie point of the lithium tantalate single crystal at a cooling rate of 300° C./hour, and after it was maintained at this temperature, it was gradually cooled to room temperature at a cooling rate of 60° C./hour to form a Na/Mg-containing thin film of lithium niobate single crystal having a thickness of about 33 μm on the substrate material.

(4) The amounts of sodium and magnesium contained in the thin film of lithium niobate single crystal were 2 mol % and 6 mol %, respectively. The thus obtained thin film had a lattice constant (a-axis) of 5.155 Å and a refractive index of 2.231±0.001 as measured at an incident light wavelength of 1.15 μm.

(5) The thin film of lithium niobate single crystal was subjected to end face lapping perpendicular to the 5 μm wide MgO diffusion channel. When a laser beam was allowed to impinge into the end face to observe the near field pattern of the outgoing beam, it was identified that the laser beam was successfully confined in the 5 μm wide MgO diffusion channel.

The thin film of lithium niobate single crystal had a surface roughness of $R_{max}=1,000$ Å as measured according to JIS B0601.

EXAMPLE 8

(1) Into an iridium crucible was introduced a mixture of 2.8 mol % of $Na_2CO_3$, 40 mol % of $V_2O_5$, 10 mol % of $Nb_2O_5$, 7.2 mol % of $Li_2CO_3$ and MgO in an amount of 5 mol % added per theoretical amount of $LiNbO_3$ precipitatable from the melt composition, and the mixture in the crucible was melted by heating to 1,100° C. in an epitaxial growth apparatus under aerobic conditions.

(2) The melt was gradually cooled to 941° C. at a cooling rate of 60° C./hour. A lithium tantalate single crystal was subjected to optical lapping on the (0001) plane to provide a thickness of 1.0 mm and then chamfering (rounding, R=0.1 mm, JIS B0701), and then a 400 Å thick titanium film having a 5 μm wide window was formed by photolithography and RF sputtering, followed by heat diffusion at 950° C. to provide a substrate material having a 5 μm wide Ti-undiffused channel. The diffusion layer had a thickness of 400 Å.

The Ti-diffused portion had a refractive index of ordinary ray increased by $2\times10^{-3}$ compared with the channel portion. The substrate had a surface roughness of $R_{max}=100$ Å as measured according to JIS B0601.

The substrate material was preheated at 941° C. for 30 minutes and then immersed in the melt under rotation at 100 rpm for 15 minutes.

A thin film of lithium niobate single crystal was formed at a growing rate of 0.53 μm/min.

(3) After the substrate material was drawn up from the melt and further rotated at 1,000 rpm above the melt for 30 seconds to fling off the unnecessary portion of melt therefrom, it was gradually cooled to room temperature at a cooling rate of 60° C./hour to form a Na/Mg containing thin film of lithium niobate single crystal having a thickness of about 8 μm on the substrate material.

(4) The amounts of sodium and magnesium contained in the thin film of lithium niobate single crystal were 1 mol % and 6 mol %, respectively. The thus obtained thin film had a lattice constant (a-axis) of 5.153 Å, and a refractive index of 2.231±0.001 as measured at an incident light wavelength of 1.15 μm.

(5) The thin film of lithium niobate single crystal was subjected to end face lapping perpendicular to the 5 μm wide Ti-undiffused channel. When a laser beam was allowed to impinge into the end face to observe the near field pattern of the outgoing beam, it was identified that the laser beam was successfully confined in the 5 μm wide Ti-undiffused channel.

The thin film of lithium niobate single crystal had a surface roughness of $R_{max}=1,000$ Å as measured according to JIS B0601.

EXAMPLE 9

(1) Into an iridium crucible was introduced a mixture of 12.5 mol % of $Na_2CO_3$, 37.5 mol % of $Li_2CO_3$, 40.0 mol % of $V_2O_5$, 10.0 mol % of $Nb_2O_5$ and $Nd_2O_3$ in an amount of 0.8 mol % added per theoretical amount of $LiNbO_3$ precipitatable from the melt composition, and the mixture in the crucible was melted by heating to 1,100° C. in an epitaxial growth apparatus under aerobic conditions.

(2) After the melt was gradually cooled to 929° C. at a cooling rate of 60° C./hour, a lithium tantalate single crystal was subjected to optical lapping and chemical etching, on the (0001) plane, to provide a thickness of 0.6 mm and then chamfering (beveling, C=0.005 mm, JIS B0701), and a Ni film having a thickness of 400 Å was formed by RF sputtering, followed by heat diffusion at 1000° C. to provide a substrate material. The diffusion layer had a thickness of 400 Å. The substrate material had a refractive index of ordinary ray increased by $1 \times 10^{-3}$ compared with the Ni-undiffused substrate material. The substrate had a surface roughness of $R_{max}=100$ Å as measured according to JIS B0601.

The substrate material was immersed in the melt under rotation at 100 rpm for 7 minutes. A thin film of lithium niobate single crystal was formed at a growing rate of 1.86 μm/min.

(3) The substrate material was drawn up from the melt and further rotated at 1,000 rpm above the melt for 30 seconds to fling off the unnecessary portion of melt therefrom. The substrate material was then rapidly cooled to 600° C. at 20° C./min and then gradually to room temperature at a cooling rate of 1° C./min to form a Na/Nd containing thin film of lithium niobate single crystal having a thickness of about 13 μm on the substrate material.

The thin film of lithium niobate single crystal had a surface roughness of $R_{max}=1,000$ Å as measured according to JIS B0601.

(4) The amounts of sodium and neodymium contained in the thin film of lithium niobate single crystal were 1.2 mol % and 0.4 mol %, respectively. The thus obtained thin film had a lattice constant (a-axis) of 5.153 Å and a refractive index of $2.232 \pm 0.001$ as measured at an incident light wavelength of 1.15 μm.

EXAMPLE 10

(1) Into an iridium crucible was introduced a mixture of 25.8 mol % of $Na_2CO_3$, 24.2 mol % of $Li_2CO_3$, 40.0 mol % of $V_2O_5$, 10.0 mol % of $Nb_2O_5$ and $TiO_2$ in an amount of 12.0 mol % added per theoretical amount of $LiNbO_3$ precipitatable from the melt composition, and the mixture in the crucible was melted by heating to 1,100° C. in an epitaxial growth apparatus under aerobic conditions.

(2) The melt was gradually cooled to 893° C. at a cooling rate of 60° C./hour. After a 1.7 mm thick lithium tantalate single crystal was subjected to optical lapping on the (0001) plane, a MgO film having a thickness of 800 Å and a width of 5 μm and then a Cu film having a thickness of 400 Å were formed over the rest of the width of the lithium tantalate single crystal, by photolithography and RF sputtering, followed by heat diffusion at 1,000° C. to provide a diffusion layer having a thickness of 400 Å. The thus treated lithium tantalate single crystal having a 5 μm wide MgO diffusion channel was subjected to chemical etching to provide a substrate material. The channel portion having MgO diffused therein had a refractive index of ordinary ray of smaller by $10 \times 10^{-3}$, and the rest of the portions having Cu diffused therein had a refractive index of ordinary ray of greater by $1 \times 10^{-3}$, respectively, compared with that of the nondiffused substrate material. The substrate had a surface roughness of 500 Å as measured according to JIS B0601.

The substrate material was preheated at 893° C. for 60 minutes at the height of 10 mm from the surface of the melt and then immersed in the melt under rotation at 100 rpm for 12 minutes. A thin film of lithium niobate single crystal was formed at a growing rate of 0.58 μm/min.

(3) After the substrate material was drawn up from the melt and further rotated at 1,000 rpm above the melt for 30 seconds to fling off the unnecessary portion of melt therefrom, it was gradually cooled to room temperature at a cooling rate of 2° C./min to form a Na/Ti containing thin film of lithium niobate single crystal having a thickness of about 7 μm on the substrate material.

(4) The amounts of sodium and titanium contained in the thin film of lithium niobate single crystal were 4.6 mol % and 5.0 mol %, respectively.

The thus obtained thin film had a lattice constant (a-axis) of 5.153 Å and a refractive index of $2.241 \pm 0.001$ as measured at an incident light wavelength of 1.15 μm.

The thus obtained thin film of lithium niobate single crystal had a surface roughness of $R_{max}=2,000$ Å as measured according to JIS B0601.

(5) The thin film of lithium niobate single crystal was subjected to end face lapping perpendicular to the 5 μm wide MgO-diffused channel. When a laser beam was allowed to impinge into the end face to observe the near field pattern of the outgoing beam, it was identified that the laser beam was successfully confined in the 5 μm wide MgO-diffused channel.

EXAMPLE 11

(1) A thin film of $LiNbO_3$ single crystal as obtained in Example 5 was subjected to mirror finishing on the surface to provide a slab-type waveguide having the $LiNbO_3$ film as the waveguide layer.

(2) The slab-type waveguide was subjected to ion beam etching to adjust its phase matching film thickness to $2.50 \pm 0.05$ μm.

(3) A ridge-type channel waveguide having a width of 10 μm, a film thickness of $2.50 \pm 0.05$ μm and a level difference of 1 μm was produced by photolithography using the slab type waveguide prepared through (1) and (2).

(4) A SHG device was provided by subjecting the channel waveguide obtained in (3) to mirror finishing at both end faces by buffing to allow incoming and outgoing of light through the end faces.

(5) The SHG device having a channel type waveguide prepared in (4) was accurately aligned with a semiconductor laser chip so that the light accepting end face of the channel waveguide may oppose to the light emitting zone of the semiconductor laser chip, and these two devices were secured on a silicon block using a UV-curable adhesive.

Wires were bonded to the electrodes protruding from the upper and lower surfaces of the semiconductor laser chip to allow supply of drive power thereacross.

(6) After integration of the semiconductor laser chip and the SHG device as described above, the integrated unit was placed in an airtight metallic package, and the wires were electrically connected with external pins to allow supply of operating power across these pins. A cap having a wavelength selective glass window panel was fitted and a high-purity nitrogen gas was hermetically sealed in the internal portion of the package.

When an operating voltage was applied to the hermetically sealed package device prepared using the SHG device made of the $LiNbO_3$ thin film according to this invention in such a way that the semiconductor laser output may be 48.0 mW, the second harmonic output outgoing through the glass window panel was 2.0 mW under the semiconductor laser output of 0.1 mW. Thus the second harmonic was extracted efficiently.

EXAMPLE 12

(1) Into a platinum crucible was introduced a mixture of 29 mol % of $Na_2CO_3$, 21 mol % of $Li_2CO_3$, 40 mol % of $V_2O_5$, 10 mol % of $Nb_2O_5$ and MgO in an amount of 5 mol % added per theoretical amount of $LiNbO_3$ precipitatable from the melt composition ($MgO/Nb_2O = 10/95$), and the mixture in the crucible was melted by heating to 1,100° C. in an epitaxial growth apparatus under aerobic conditions.

(2) The melt was gradually cooled to 907° C. at a cooling rate of 60° C./hour. A Na-containing lithium tantalate single crystal was subjected to optical lapping and then chemical etching, on the (0001) plane, to give a thickness of 1.0 mm, followed by chamfering (beveling) to provide a substrate material. The substrate had a surface roughness of $R_{max} = 300$ Å as measured according to JIS B0601.

The amount of sodium contained in the substrate material was 4 mol %. The substrate material had a lattice constant (a-axis) of 5.163 Å. The substrate material was preheated for 30 minutes at the height of 15 mm from the surface of the melt and then immersed in the melt under rotation at 100 rpm for 7 minutes. A thin film of lithium niobate single crystal was formed at a growing rate of 1.14 μm/min.

(3) After the substrate material was drawn up from the melt and further rotated at 1,000 rpm above the melt for 30 seconds to fling off the unnecessary portion of melt therefrom, it was gradually cooled to the Curie point of the lithium tantalate single crystal at a cooling rate of 5° C./min, maintained at this temperature for one hour and further gradually cooled to room temperature at a cooling rate of 60° C./hour to form a Na/Mg containing thin film of lithium niobate single crystal having a thickness of about 8 μm on the substrate material.

(4) The amounts of sodium and magnesium contained in the thin film of lithium niobate single crystal were 7 mol % and 6 mol %, respectively. The thin film of lithium niobate single crystal had a lattice constant (a-axis) of 5.163 Å and a refractive index of 2.232±0.001 measured at an incident light wavelength of 1.15 μm.

The thin film of lithium niobate single crystal had a surface roughness of $R_{max} = 2,000$ Å as measured according to JIS B0601.

EXAMPLE 13

(1) Into a platinum crucible was introduced a mixture of 7 mol % of $Na_2CO_3$, 43 mol % of $Li_2CO_3$, 40 mol % of $V_2O_5$, 10 mol % of $Nb_2O_5$, MgO in an amount of 5 mol % added per theoretical amount of $LiNbO_3$ precipitatable from the melt composition ($MgO/Nb_2O_5 = 10/95$) and $TiO_2$ in an amount of 12 mol % added per theoretical amount of $LiNbO_3$ precipitatable from the melt composition, and the mixture in the crucible was melted by heating to 1,100° C. in an epitaxial growth apparatus under aerobic conditions.

(2) The melt was gradually cooled to 932° C. at a cooling rate of 60° C./hour. A titanium-containing lithium tantalate single crystal was subjected to optical lapping and then chemical etching, on the (0001) plane, to provide a substrate having a thickness of 0.8 mm. The substrate material contained 9 mol % of titanium and had a surface roughness of $R_{max} = 100$ Å as measured according to JIS B0601.

The substrate material had a lattice constant (a-axis) of 5.146 Å. The substrate material was immersed in the melt under rotation at 100 rpm for 18 minutes.

A thin film of lithium niobate single crystal was formed at a growing rate of 0.72 μm/min.

(3) After the substrate material was drawn up from the melt and further rotated at 1,000 rpm above the melt for 30 seconds to fling off the unnecessary portion of melt therefrom, it was gradually cooled to room temperature at a cooling rate of 1° C./min to form a Na/Mg/Ti containing thin film of lithium niobate single crystal having a thickness of about 13 μm on the substrate material.

(4) The amounts of sodium, magnesium and titanium contained in the thin film of lithium niobate single crystal were 0.3 mol %, 6 mol % and 5 mol %, respectively. The thin film of lithium niobate single crystal had a lattice constant (a-axis) of 5.146 Å and a refractive index of 2.240±0.001 as measured at an incident light wavelength of 1.15 μm.

The thin film of lithium niobate single crystal had a surface roughness of $R_{max} = 2,000$ Å as measured according to JIS B0601.

EXAMPLE 14

(1) Into a platinum crucible was introduced a mixture of 12.3 mol % of $Na_2CO_3$, 37.7 mol % of $Li_2CO_3$, 40 mol % of $V_2O_5$, 10 mol % of $Nb_2O_5$ and MgO in an amount of 5 mol % added per theoretical amount of $LiNbO_3$ precipitatable from the melt composition ($MgO/Nb_2O_5 = 10/95$), and the mixture in the crucible was melted by heating to 1,100° C. in an epitaxial growth apparatus under aerobic condition.

(2) The melt was gradually cooled to 935° C. at a cooling rate of 60° C./hour. An alumina ($\alpha$-$Al_2O_3$) single crystal was subjected to optical lapping and then chemical etching, on the (0001) plane, to provide a substrate having a thickness of 2 mm. The substrate material had a surface roughness of $R_{max} = 50$ Å as measured according to JIS B0601.

After the substrate material was preheated at 935° C. for 45 minutes at the height of 10 mm from the surface of the melt, it was immersed in the melt under rotation at 100 rpm for 12 minutes.

A thin film of lithium niobate single crystal was formed at a growing rate of 1.08 μm/min.

(3) After the substrate material was drawn up from the melt and further rotated at 1,000 rpm above the melt for 30 seconds to fling off the unnecessary portion of melt therefrom, it was cooled rapidly at a cooling rate of 20° C./min and then gradually at a cooling rate of 1° C./min to room temperature to form a Na/Mg containing thin film of lithium niobate single crystal having a thickness of about 13 μm on the substrate material.

(4) The amounts of sodium and magnesium contained in the thin film of lithium niobate single crystal were 1 mol % and 6 mol %, respectively. The thin film of lithium niobate single crystal had a lattice constant (a-axis) of 5.153 Å and a refractive index of 2.231±0.001 as measured at an incident light wavelength of 1.15 μm.

The thin film of lithium niobate single crystal had a surface roughness of $R_{max}$=1,400 Å as measured according to JIS B0601.

EXAMPLE 15

(1) Into a platinum crucible was introduced a mixture of 26.4 mol % of $Li_2CO_3$, 28.6 mol % of $Nb_2O_5$, 22.5 mol % of $K_2CO_3$, 22.5 mol % of $V_2O_5$ and MgO in an amount of 5 mol % added per theoretical amount of $LiNbO_3$ precipitatable from the melt composition, and the mixture in the crucible was melted by heating to 1,100° C. in an epitaxial growth apparatus under aerobic conditions.

(2) The melt was gradually cooled to 893° C. at a cooling rate of 60° C./hour. After a lithium tantalate single crystal was subjected to optical lapping on the (0001) plane to give a thickness of 1.5 mm, a MgO film having a thickness of 800 Å and a width of 5 μm and then a Cu film having a thickness of 400 Å were formed over the rest of the width of the lithium tantalate single crystal, by photolithography and RF sputtering, followed by heat diffusion at 1,000° C. to provide diffusion layers. Both the MgO diffusion layer and the CuO diffusion layer had a thickness of 500 Å.

The thus treated lithium tantalate single crystal having a 5 μm wide MgO diffusion channel was subjected to chemical etching to provide a substrate material.

The channel portion having MgO diffused therein had a refractive index of ordinary ray of smaller by $10 \times 10^{-3}$, and the rest of the portions having Cu diffused therein had a refractive index of ordinary ray of greater by $1 \times 10^{-3}$, compared with that of the nondiffused substrate material. The substrate had a surface roughness of $R_{max}$=400 Å as measured according to JIS B0601.

The substrate material was preheated at 893° C. for 11 minutes at the height of 15 mm from the surface of the melt and then immersed in the melt under rotation at 100 rpm for 11 minutes.

A thin film of lithium niobate single crystal was formed at a growing rate of 0.54 μm/min.

(3) After the substrate material was drawn up from the melt and further rotated at 1,000 rpm above the melt for 30 seconds to fling off the unnecessary portion of melt therefrom, it was gradually cooled to room temperature at a cooling rate of 1° C./min to form a MgO-containing thin film of lithium niobate single crystal having a thickness of about 6 μm on the substrate material.

The thin film of lithium niobate single crystal had a lattice constant (a-axis) of 5.153 Å and a refractive index of 2.230±0.001 as measured at an incident light wavelength of 1.15 μm. The thin film of lithium niobate single crystal had a surface roughness of $R_{max}$=1,400 Å as measured according to JIS B0601.

EXAMPLE 16

(1) Into an iridium crucible was introduced a mixture of 50 mol % of $Li_2CO_3$, 40 mol % of $V_2O_5$, 10 mol % of $Nb_2O_5$, $Na_2CO_3$ in an amount of 43 mol % added per theoretical amount of $LiNbO_3$ precipitatable from the melt composition and MgO in an amount of 7 mol % added per theoretical amount of $LiNbO_3$ precipitatable from the melt composition, and the mixture in the crucible was melted by heating to 1,100° C. in an epitaxial growth apparatus under aerobic conditions.

Subsequently, the melt was stirred using a propeller at a speed of 200 rpm for 12 hours.

(2) The melt was gradually cooled to 915° C. at a cooling rate of 60° C./hour. After a lithium tantalate single crystal was subjected to optical lapping on the (0001) plane to give a thickness of 1.8 mm, followed by chamfering (beveling, C=0.01 mm, JIS B0701).

An MgO film having a film thickness of 1,000 Å and a width of 5 μm was formed by photolithography and RF sputtering. The thus obtained substrate was then brought closer at 2.67 cm/min to the melt in the epitaxial growth apparatus to effect preheating and heat diffusion simultaneously.

The diffusion layer had a thickness of 1,000 Å.

The substrate material was immersed in the melt under rotation at 100 rpm for 17 minutes. A thin film of lithium niobate single crystal was formed at a growing rate of 1.94 μm/min.

(3) After the substrate material was drawn up from the melt and further rotated at 1,000 rpm above the melt for 30 seconds to fling off the unnecessary portion of melt therefrom, it was cooled to the Curie point of the lithium tantalate single crystal at a cooling rate of 300° C./hour, maintained at this temperature for one hour and then further cooled gradually to room temperature at a cooling rate of 60° C./hour to form a Na/Mg-containing thin film of lithium niobate single crystal having a thickness of about 30 μm on the substrate material.

(4) The amounts of sodium and magnesium contained in the thin film of lithium niobate single crystal were 2 mol % and 6 mol %, respectively. The thin film of lithium niobate single crystal had a lattice constant (a-axis) of 5.155 Å and a refractive index of 2.231±0.001 as measured at an incident light wavelength of 1.15 μm.

(5) The thin film of lithium niobate single crystal was subjected to end face lapping perpendicular to the 5 μm wide MgO-diffusion channel. When a laser beam was allowed to impinge into the end face to observe the near field pattern of the outgoing beam, it was identified that the laser beam was successfully confined in the 5 μm wide MgO-diffusion channel.

The thus obtained thin film of lithium niobate single crystal had a surface roughness of $R_{max}$=900 Å as measured according to JIS B0601.

EXAMPLE 17

(1) Into a platinum crucible was introduced a mixture of 22.0 mol % of $Li_2CO_3$, 33.0 mol % of $Nb_2O_5$, 22.5 mol % of $K_2CO_3$, 22.5 mol % of $V_2O_5$ and MgO in an amount of 5 mol % added per theoretical amount of $LiNbO_3$ precipitatable from the melt composition, and the mixture in the crucible was melted by heating to 1,100° C. in an epitaxial growth apparatus under aerobic conditions.

(2) The melt was gradually cooled to 893° C. at a cooling rate of 60° C./hour. After a lithium tantalate single crystal was subjected to optical lapping on the (0001) plane to give a thickness of 1.5 mm. The thus treated lithium tantalate single crystal had a surface roughness of $R_{max}$=400 Å as measured according to JIS B0601.

The thus obtained substrate material was preheated at 893° C. at the height of 15 mm from the surface of the melt and then immersed in the melt under rotation at 100 rpm for 11 minutes.

A thin film of lithium niobate single crystal was formed at a growing rate of 0.54 μm/min.

(3) After the substrate material was drawn up from the melt and further rotated at 1,000 rpm above the melt for 30 seconds to fling off the unnecessary portion of melt therefrom, it was gradually cooled to room temperature at a cooling rate of 1° C./min to form a MgO-containing thin film of lithium niobate single crystal having a thickness of about 6 μm on the substrate material.

The thin film of lithium niobate single crystal had a lattice constant (a-axis) of 5.154 Å and a refractive index of 2.231±0.001 as measured at an incident light wavelength of 1.15 μm.

The thin film of lithium niobate single crystal had a surface roughness of $R_{max}$=1,400 Å as measured according to JIS B0601.

EXAMPLE 18

The procedures of Example 1 were repeated analogously except that MgO was omitted and that the amount of Na to be contained in the thin film of lithium niobate single crystal to be formed by liquid phase epitaxial growth was varied by changing the amounts of $Na_2CO_3$ and $LiaCO_3$.

The lattice constants (a-axis) of the lithium niobate single crystals having different Na content were measured by X-ray powder diffractometry, and the relationship between the Na content in the thin film of lithium niobate single crystal and the a-axis lattice constant thereof is as shown in FIG. 4. Further, an example of X-ray powder diffraction is as shown in FIG. 3.

EXAMPLE 19

The procedures of Example 17 were repeated analogously except that MgO doping was omitted and that the ratio of $Li_2CO_3$ to $Nb_2O_5$ in the raw material composition was varied to allow thin films of lithium niobate single crystal to grow.

The lattice constants (a-axis) of the lithium niobate single crystals having different $Li_2CO_3/Nb_2O_5$ ratio were measured by X-ray powder diffractometry, and the relationship between the $Li_2CO_3/Nb_2O_5$ ratio and the a-axis lattice constant of the thin film of lithium niobate single crystal is as shown in FIG. 5.

EXAMPLE 20

(1) A mixture of raw materials was prepared by adding 50 mol % of $Li_2CO_3$, 40 mol % of $V_2O_5$, 10 mol % of $Nb_2O_5$ and various amounts of $TiO_2$ to be added per theoretical amount of $LiNbO_3$ precipitatable from the melt composition. The respective mixtures were introduced into platinum crucibles, respectively and melted by heating to 1,100° C. in an epitaxial growth apparatus under aerobic conditions.

(2) The melt was gradually cooled to 932° C. at a cooling rate of 60° C./hour. After a lithium tantalate single crystal containing titanium was subjected to optical lapping and then chemical etching, on the (0001) plane, to give a thickness of 0.8 mm to provide a substrate material. The thus treated substrate contained 9 mol % of titanium and had a surface roughness of $R_{max}$=100 Å as measured according to JIS B0601.

(3) After the substrate material was drawn up from the melt and further rotated at 1,000 rpm above the melt for 30 seconds to fling off the unnecessary portion of melt therefrom, it was gradually cooled to room temperature at a cooling rate of 1° C./min.

The relationship between the Ti contents in the thus formed thin films of lithium niobate single crystal and the a-axis constants thereof is as shown in FIG. 6.

EXAMPLE 21

The procedures of Example 1 were repeated analogously except that the amounts of $Na_2CO_3$ and $Li_2CO_3$ were varied so as to prepare thin films of lithium niobate single crystal having different Na content by liquid phase epitaxial growth.

The content of MgO was 5 mol %.

The a-axis lattice constants of the lithium niobate single crystals having different Na content were measured by X-ray powder diffractometry, and the relationship between the Na content and the a-axis lattice constant of the thin film of lithium niobate single crystal is as shown in FIG. 7. In FIG. 7, the relationship between the Na contents and the a-axis lattice constants of thin films of lithium niobate single crystal which are not doped with MgO is also shown as a control.

EXAMPLE 22

(1) Into platinum crucibles were introduced mixtures of 50 mol % of $Li_2CO_3$, 40 mol % of $V_2O_5$, 10 mol % of $Nb_2O_5$ and various amounts of MgO to be added per theoretical amount of $LiNbO_3$ precipitatable from the melt composition, respectively, to prepare mixtures of different compositions.

Subsequently, the mixtures in the respective crucibles were melted by heating to 1,100° C. in an epitaxial growth apparatus under aerobic conditions.

The melt was further stirred using a propeller at a speed of 100 rpm for 12 hours.

(2) A 2 mm thick lithium tantalate single crystal was subjected to optical lapping and then chemical etching, on the (0001) plane, followed by chamfering (rounding).

After the melt was gradually cooled to 915° C. at a cooling rate of 60° C./hour, the thus treated substrate was preheated at 915° C. for 30 minutes and then immersed in the melt under rotation at 100 rpm for 8 minutes. A thin film of lithium niobate single crystal was formed at a growing rate of 1 μm/min.

(3) After the substrate material was drawn up from the melt and further rotated at 1,000 rpm above the melt for 30 seconds to fling off the unnecessary portion of melt therefrom, it was gradually cooled to room temperature at a cooling rate of 1° C./min to form a Mg-containing thin film of lithium niobate single crystal having a thickness of about 8 μm on the substrate material.

(4) The a-axis lattice constant of the thus formed Mg-containing thin film of lithium niobate single crystal was measured by X-ray powder diffractometry, and the relationship between the MgO contents in the thus formed thin films of lithium niobate single crystal and the a-axis constants thereof is as shown in FIG. 8.

Examples 18 to 22 are intended to investigate the relationship between the a-axis lattice constants of the thin films of lithium niobate single crystal formed by liquid phase epitaxial growth and the compositions of lithium niobate rather than to demonstrate lattice matching, so that lattice matching between the thin film of lithium niobate single crystal and the lithium tantalate substrate is not necessarily achieved therein.

The thin films of lithium niobate single crystal obtained in Examples 1 to 17 (except for Example 11) were measured for propagation loss against a 0.83 μm semiconductor laser beam and Pockels constant (an electrooptical constant) by prism coupling method in a Mach-Zehnder interferometer, and the results are summarized in Table 1.

An example of X-ray diffraction of the present thin films of lithium niobate single crystal is shown in FIG. 3, and comparison between $2\theta$ values of 15 peaks (①) to ⑮) specific to the present lithium niobate and those or the conventional lithium niobate is shown in Table 2.

TABLE 1

| Example | Propagation loss (dB/cm) | Electrooptical constant ($\times 10^{-12}$ m/v) | |
|---|---|---|---|
| | | ($\gamma_{33}$) | ($\gamma_{13}$) |
| 1 | 1.4 | 25.1 | 6.5 |
| 2 | 2.2 | 23.2 | 6.8 |
| 3 | 1.3 | 24.4 | 6.4 |
| 4 | 1.0 | 23.6 | 6.0 |
| 5 | 1.9 | 25.0 | 6.4 |
| 6 | 26.3 | — | — |
| 7 | 2.1 | 23.7 | 5.9 |
| 8 | 0.8 | 25.4 | 6.6 |
| 9 | 1.5 | 24.6 | 6.3 |
| 10 | 14.1 | — | — |
| 11 | — | — | — |
| 12 | 1.9 | 22.1 | 5.7 |
| 13 | 2.7 | 24.1 | 6.0 |
| 14 | 3.5 | 22.7 | 5.8 |
| 15 | 4.3 | 21.4 | 5.6 |
| 16 | 1.5 | 23.7 | 5.9 |
| 17 | 1.8 | 24.9 | 6.2 |
| Control | — | 12.0 | 2.3 |

The control sample was prepared according to the method described in Applied Physics Letters, vol. 24, No. 9, 1974, p 424.

TABLE 2

| Peak No. | Plane index (h, k, l) | | | $2\theta$ value of prior art LiNbO$_3$ (deg) | $2\theta$ value of present LiNbO$_3$ (deg) |
|---|---|---|---|---|---|
| 1 | 0 | 2 | 4 | 48.515 | 48.467 |
| 2 | 1 | 1 | 6 | 53.243 | 53.213 |
| 3 | 0 | 1 | 8 | 56.993 | 56.933 |
| 4 | 2 | 1 | 4 | 61.091 | 61.043 |
| 5 | 3 | 0 | 0 | 62.435 | 62.351 |
| 6 | 2 | 0 | 8 | 68.549 | 68.495 |
| 7 | 1 | 0 | 10 | 71.207 | 71.147 |
| 8 | 2 | 2 | 0 | 73.523 | 73.427 |
| 9 | 3 | 0 | 6 | 76.091 | 75.983 |
| 10 | 3 | 1 | 2 | 78.509 | 78.419 |
| 11 | 1 | 2 | 8 | 79.247 | 79.151 |
| 12 | 0 | 2 | 10 | 81.779 | 81.683 |
| 13 | 1 | 3 | 4 | 82.811 | 82.727 |
| 14 | 2 | 2 | 6 | 86.489 | 86.381 |
| 15 | 0 | 4 | 2 | 88.847 | 88.739 |

Note:
a-axis lattice constant of prior art LiNbO$_3$ = 5.1483 Å
a-axis lattice constant of present LiNbO$_3$ = 5.1535 Å
The $2\theta$ values are the angles of diffraction against the CuK $\alpha_1$ ray.

APPLICABILITY IN INDUSTRIES

According to this invention, a thin film of lithium niobate single crystal having very excellent optical properties which have never been attained in the prior art and also having a sufficient thickness to be used as optical devices can practically be formed on a lithium tantalate substrate, so that the present thin film of lithium niobate single crystal is not only best suited as a constituent of thin film wave-guiding SHG devices but also useful as a constituent of light modulators and multi-mode system optical devices.

I claim:

1. A thin film of lithium niobate single crystal formed on a (0001) surface of a lithium tantalate substrate wherein the thin film has an a-axis lattice constant in the range of 99.92 to 100.03% of the a-axis lattice constant of the lithium tantalate substrate, and the thin film is lattice matched with the substrate to thereby improve the optical properties of the thin film.

2. The thin film of lithium niobate single crystal according to claim 1, which contains sodium and magnesium.

3. The thin film of lithium niobate single crystal according to claim 2, wherein the sodium content and magnesium content are 0.1 to 14.3 mol % and 0.8 to 10.8 mol %, respectively.

4. The thin film of lithium niobate single crystal according to claim 1, which is formed on the (0001) plane of the lithium tantalate substrate.

5. The thin film of lithium niobate single crystal according to claim 1, wherein the lithium tantalate substrate has a MgO diffusion layer having a thickness of 250 to 1,000 Å.

6. The thin film of lithium niobate single crystal according to claim 1 wherein said lithium tantalate substrate has a surface roughness of lithium niobate single crystal thin film formation surface of Rmax=10 to 1,000 angstroms.

7. The thin film of lithium niobate single crystal according to claim 1 wherein said thin film contains at least one element selected from the group consisting of chromium (Cr), neodymium (Nd), rhodium (Rh), zinc (Zn), nickel (Ni), cobalt (Co), titanium (Ti), and vanadium (V).

8. The thin film of lithium niobate single crystal according to claim 7 wherein the elements are contained in amounts of:
Rh: 0.05 to 20 mole %,
Zn: 0.02 to 30 mole %,
Ni: 0.10 to 20 mole %,
Co: 0.05 to 20 mole %,
Cr: 0.02 to 20 mole %,
Ti: 0.20 to 30 mole %,
Nd: 0.02 to 10 mole %,
V: 0.05 to 30 mole %.

9. The thin film of lithium niobate single crystal according to claim 1 wherein said lithium tantalate substrate has chamfered edges.

10. The thin film of lithium niobate single crystal according to claim 1 wherein said lithium niobate single crystal thin film has a surface roughness of Rmax=0.001 to 0.01 μm.

11. A thin film of lithium single crystal formed on the (0001) plan of a lithium tantalate substrate wherein the thin film contains sodium in an amount of 0.1 to 14.3 mole % and magnesium in an amount of 0.8 to 10.8 mole %, has an a-axis lattice constant in the range of 99.92 to 100.03% of the a-axis lattice constant of the lithium tantalate substrate, and the thin film is lattice matched with the lithium tantalate substrate to thereby improve the optical properties of the thin film.

12. The thin film of lithium niobate single crystal according to claim 11, wherein the lithium tantalate substrate has a MgO diffusion layer having a thickness of 250 to 1,000 Å.

13. The thin film of lithium niobate single crystal according to claim 11, wherein the thin film contains sodium in an amount of 0.03 to 4.8 mole % and magnesium in an amount of 3.5 to 8.6 mole %.

14. The thin film of lithium niobate single crystal formed on the lithium tantalate substrate of claim 11 wherein the lithium tantalate substrate has a thickness of 0.5 to 2.0 mm.

15. The thin film of lithium niobate single crystal according to claim 11 wherein said thin film contains at least one element selected from the group consisting of chromium (Cr), neodymium (Nd), rhodium (Rh), zinc (Zn), nickel (Ni), cobalt (Co), titanium (Ti), and vanadium (V), and wherein the elements are in the amounts of:

Rh: 0.05 to 20 mole %,
Zn: 0.02 to 30 mole %,
Ni: 0.10 to 20 mole %,
Co: 0.05 to 20 mole %,
Cr: 0.02 to 20 mole %,
Ti: 0.20 to 30 mole %,
Nd: 0.02 to 10 mole %,
V: 0.05 to 30 mole %.

16. The thin film of lithium niobate single crystal according to claim 11, wherein said lithium niobate single crystal thin film has a surface roughness of Rmax=0.001 to 0.01 μm.

* * * * *